US011627269B2

(12) United States Patent
Nakamura et al.

(10) Patent No.: US 11,627,269 B2
(45) Date of Patent: Apr. 11, 2023

(54) ANALOG-TO-DIGITAL CONVERSION CIRCUIT USING COMPARATOR AND COUNTER, PHOTOELECTRIC CONVERSION APPARATUS USING COMPARATOR AND COUNTER, AND PHOTOELECTRIC CONVERSION SYSTEM USING COMPARATOR AND COUNTER

(71) Applicant: CANON KABUSHIKI KAISHA, Tokyo (JP)

(72) Inventors: Kohichi Nakamura, Kanagawa (JP); Hiroaki Kameyama, Kanagawa (JP); Koichiro Iwata, Kanagawa (JP); Yu Arishima, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/516,010

(22) Filed: Nov. 1, 2021

(65) Prior Publication Data

US 2022/0141414 A1 May 5, 2022

(30) Foreign Application Priority Data

Nov. 4, 2020 (JP) .............................. JP2020-184492

(51) Int. Cl.
*H04N 5/374* (2011.01)
*H04N 5/376* (2011.01)
(Continued)

(52) U.S. Cl.
CPC ........ *H04N 5/37455* (2013.01); *H03M 1/123* (2013.01); *H03M 1/56* (2013.01); *H04N 5/3765* (2013.01)

(58) Field of Classification Search
CPC .. H04N 5/37455; H04N 5/3765; H04N 5/378; H03M 1/56; H03M 1/125; H03M 1/007; H03M 1/825
See application file for complete search history.

(56) References Cited

U.S. PATENT DOCUMENTS

| 9,661,249 | B2* | 5/2017 | Nakamura | .............. | H04N 5/378 |
| 11,284,032 | B2* | 3/2022 | Shinohara | .............. | H04N 5/378 |

(Continued)

FOREIGN PATENT DOCUMENTS

JP 2013093837 A 5/2013

*Primary Examiner* — Marly S Camargo
(74) *Attorney, Agent, or Firm* — Canon U.S.A., Inc. IP Division

(57) ABSTRACT

An analog-to-digital conversion circuit includes a comparator circuit configured to perform processing of comparison between an analog signal and a ramp signal, and a counter configured to perform count processing in parallel with the comparison processing by the comparator circuit. The analog-to-digital conversion circuit acquires digital data, which is a count value corresponding to the comparison processing, and subjects the analog signal to analog-to-digital conversion. A period from the start to the end of the analog-to-digital conversion of the one analog signal includes a first period and a second period following the first period. The first and the second periods are switched based on an output of the counter. The count processing is performed at a high speed during the first period and performed at a low speed during the second period.

20 Claims, 18 Drawing Sheets

(51) Int. Cl.
*H04N 5/378* (2011.01)
*H03M 1/00* (2006.01)
*H03M 1/56* (2006.01)
*H03M 1/12* (2006.01)
*H03M 1/82* (2006.01)
*H04N 5/3745* (2011.01)

(56) References Cited

U.S. PATENT DOCUMENTS

| | | | |
|---|---|---|---|
| 2005/0057389 A1* | 3/2005 | Krymski | H04N 5/335 341/169 |
| 2009/0009635 A1* | 1/2009 | Maeda | H04N 5/217 48/241 |
| 2009/0167915 A1* | 7/2009 | Hirota | H04N 5/378 348/302 |
| 2013/0087688 A1* | 4/2013 | Saito | H03K 4/06 250/208.1 |
| 2013/0271633 A1* | 10/2013 | Hashimoto | H04N 5/353 348/300 |
| 2017/0313243 A1* | 11/2017 | Ise | H04N 5/243 |

* cited by examiner

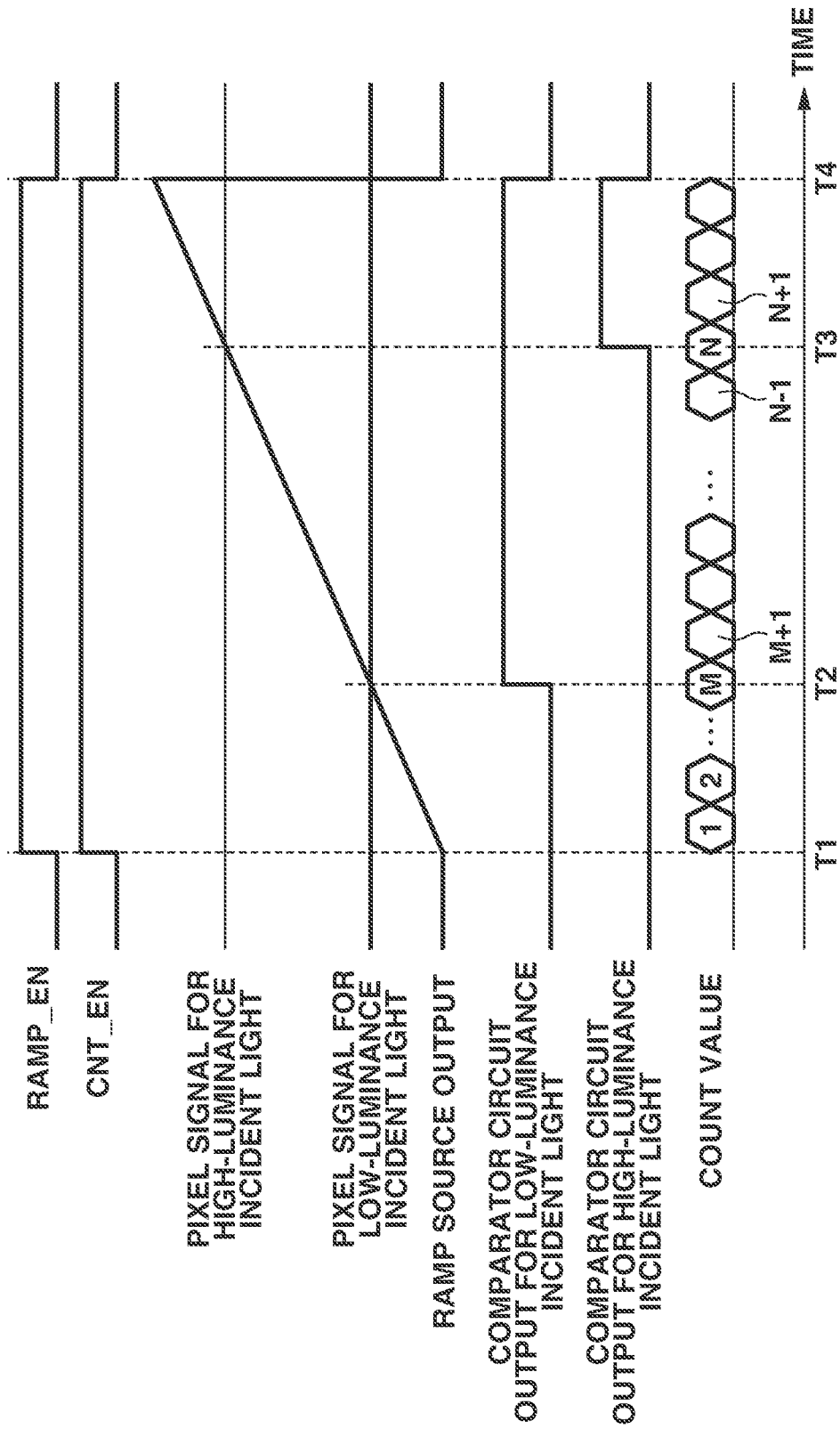

ANALOG-TO-DIGITAL CONVERSION CIRCUIT USING COMPARATOR AND COUNTER, PHOTOELECTRIC CONVERSION APPARATUS USING COMPARATOR AND COUNTER, AND PHOTOELECTRIC CONVERSION SYSTEM USING COMPARATOR AND COUNTER

BACKGROUND

Technical Field

One disclosed aspect of the embodiments relates to an analog-to-digital conversion circuit, a photoelectric conversion apparatus having this analog-to-digital circuit, and an imaging system having this photoelectric conversion apparatus.

Description of the Related Art

Photoelectric conversion apparatuses employ a technique for converting a pixel signal based on electric charges generated in each pixel into digital data by using a unit for analog-to-digital conversion (hereinafter referred to as AD conversion) disposed for each column of pixels arranged in an array form. The AD conversion unit discussed in Japanese Patent Application Laid-Open No. 2013-093837 compares a magnitude relation between the potential of a reference signal having a time-varying potential and the potential of a pixel signal, and measures the time duration from the time when AD conversion starts up to the time when the magnitude relation between the potentials of the reference and pixel signals is inverted, thus implementing AD conversion. According to Patent Document 1, each column is provided with a column memory as a time measurement unit. The column memory stores a count value corresponding to the inverted magnitude relation between the potentials of the reference and the pixel signals for each column by using a common counter commonly connected to the column memories of a plurality of columns.

A photoelectric conversion apparatus discussed in Japanese Patent Application Laid-Open No. 2013-093837 has an issue of large power consumption of a counter circuit due to a fixed operation of the counter circuit regardless of the luminance of incident light.

SUMMARY

One disclosed aspect of the embodiments has been devised in view of the above-described issue, and is directed to the reduction of power consumption of the counter circuit.

According to an aspect of the disclosure, an analog-to-digital conversion circuit includes a comparator circuit configured to perform processing of comparison between an analog signal and a ramp signal, and a counter configured to perform count processing in parallel with the comparison processing by the comparator circuit. The analog-to-digital conversion circuit acquires digital data, which is a count value corresponding to the comparison processing, and subjects the analog signal to analog-to-digital conversion. A period from the start to the end of the analog-to-digital conversion of the one analog signal includes a first period and a second period following the first period, wherein the first and the second periods are switched based on an output of the counter. The count processing is performed at a high speed during the first period and performed at a low speed during the second period.

According to another aspect of the disclosure, an analog-to-digital conversion circuit includes a comparator circuit configured to perform processing of comparison between an analog signal and a ramp signal, and a counter configured to perform count processing in parallel with the comparison processing by the comparator circuit. The analog-to-digital conversion circuit acquires digital data, which is a count value corresponding to the comparison processing, and subjects the analog signal to analog-to-digital conversion. A period from the start to the end of the analog-to-digital conversion of the one analog signal includes a first period and a second period following the first period. The first and the second periods are switched based on an output of the counter. During the first period, the analog-to-digital conversion circuit performs the analog-to-digital conversion with a first resolution. During the second period, the analog-to-digital conversion circuit performs the analog-to-digital conversion with a second resolution that is lower than the first resolution.

According to still another aspect of the disclosure, an analog-to-digital conversion circuit includes a comparator circuit configured to perform processing of comparison between an analog signal and a ramp signal, and a counter configured output a count value having a plurality of bits. The counter performs count processing in parallel with the comparison processing by the comparator circuit to output the count value. The analog-to-digital conversion circuit acquires digital data, which is a count value corresponding to the comparison processing, and performs analog-to-digital conversion. A period from the start to the end of the analog-to-digital conversion of the one analog signal includes a first period and a second period following the first period. The first and the second periods are switched based on an output of the counter unit, and wherein at least one bit from the least significant bit side of the plurality of bits a signal of which changes during the first period is fixed to a predetermined potential during the second period.

According to yet another aspect of the disclosure, an analog-to-digital conversion circuit includes a comparator circuit configured to perform processing of comparison between an analog signal and a ramp signal, and a counter configured to perform count processing in parallel with the comparison processing of the comparator circuit. The analog-to-digital conversion circuit acquires digital data, which is a count value corresponding to the comparison processing, and performs analog-to-digital conversion. The time period from the start to the end of the AD conversion on the one analog signal includes a first period and a second period following the first period. The operating frequency of the counter during the second period is lower than the operating frequency of the counter during the first period.

Further features of the disclosure will become apparent from the following description of exemplary embodiments with reference to the attached drawings.

BRIEF DESCRIPTION OF THE DRAWINGS

FIG. 2 is a timing chart illustrating an analog-to-digital (AD) conversion operation of the photoelectric conversion apparatus.

DESCRIPTION OF THE EMBODIMENTS

Each exemplary embodiment will be described below with reference to the accompanying drawings.

Each exemplary embodiment will be described below centering on an imaging apparatus as an example of a photoelectric conversion apparatus, as an example of an apparatus according to the disclosure. However, each exemplary embodiment is not limited to a photoelectric conversion apparatus but applicable to other apparatuses. Application of each exemplary embodiment to a photoelectric conversion apparatus is not limited to application to an imaging apparatus. Each exemplary embodiment is applicable, for example, to a distance measuring circuit (an apparatus for distance measurement using focus detection and Time Of Flight (TOF)) and a photometric apparatus (an apparatus for measuring the quantity of incident light).

A first exemplary embodiment according to the disclosure will be described below with reference to FIGS. 1 to 8.

(Overall Configuration of Photoelectric Conversion Apparatus)

Figure 1:
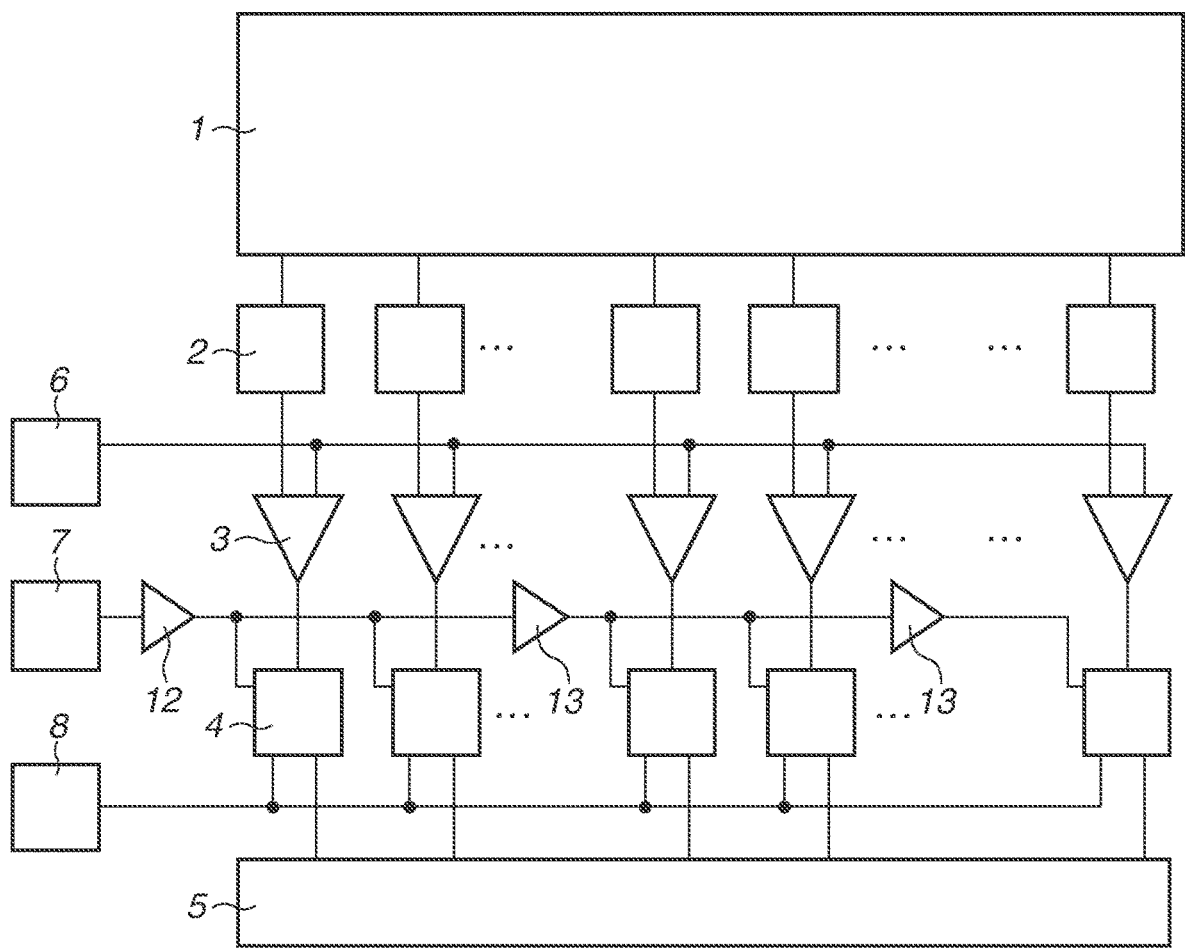
FIG. 1 schematically illustrates a configuration of a photoelectric conversion apparatus according to a first exemplary embodiment.

FIG. 1 schematically illustrates a configuration of the photoelectric conversion apparatus according to the present exemplary embodiment. The photoelectric conversion apparatus according to the present exemplary embodiment includes the following circuits: a pixel unit 1, a read circuit 2, a comparator circuit 3, a column memory 4, a horizontal scanning circuit 5, a ramp source 6, a counter circuit 7, a calculation processing circuit 8, a gating circuit 12, and a buffer circuit 13.

The pixel unit 1 is provided with a plurality of pixels arranged in an array form over a plurality of rows and a plurality of columns. In the pixel unit 1, each row of the pixel array is provided with read circuits 2 that extend in the column direction (vertical direction in FIG. 1). The read circuit 2 is connected to each pixel in a column of pixels arranged in the column direction. The read circuit 2 forms a common signal line that output electric charges generated in the pixels, as pixel signals (analog signals).

The number of pixels included in the pixel unit 1 is not particularly limited. For example, the pixel unit 1 may include several thousands of rows and several thousands of columns of pixels, like an ordinary digital camera, or may include a plurality of pixels arranged in one row or one column.

A count value output from the counter circuit 7 is input to the column memory 4 via the gating unit 12 and the buffer circuit 13. The gating circuit 12 and the buffer circuit 13 are disposed at intervals of a plurality of columns, as illustrated in FIG. 1.

The comparator circuit 3 is connected to the read circuit 2 for each column of the pixel array. The output signal of the read circuit 2 and the ramp signal generated by the ramp source 6 are input to the comparator circuit 3, and the comparator circuit 3 compares the potential magnitudes of the two input signals. When the magnitude relation between the potentials of the output signal of the read circuit 2 and the ramp signal is inverted, the potential of the output signal of the comparator circuit 3 is also inverted. When the potential of the output signal of the comparator circuit 3 is inverted, the count value output from the counter circuit 7 is stored in the column memory 4 as digital data. The comparator circuit 3 performs processing of comparison between the output and the ramp signals once based on the output signal, which is a pixel reset signal, and the output signal, which is a pixel signal, and acquires digital data for each pixel.

The digital data stored in the column memories 4 is sequentially transferred to the calculation processing circuit 8 for each column by signals output from the horizontal scanning circuit 5. The calculation processing circuit 8 performs calculation processing for subtracting the digital data corresponding to the reset signal and the digital data corresponding to the pixel signal to implement digital correlated double sampling (digital CDS). Referring to FIG. 1, pulses required for each circuit and a circuit for controlling the timing of pulses are omitted.

(AD Conversion of Photoelectric Conversion Apparatus)

An AD conversion operation of the photoelectric conversion apparatus will be described in detail below with reference to the timing chart in FIG. 2.

FIG. 2 is a timing chart in a case where the resolution of the AD conversion is fixed regardless of the luminance. The following description will be made on the premise that the level of the pixel signal increases with increasing luminance of incident light due to the processing of the read circuits 2. The read circuit 2 includes, for example, an inverting amplifier.

At time T1, a control signal RAMP_EN of the ramp source 6 and a control signal CNT_EN of the counter circuit 7 are set to High. When RAMP_EN is set to High, the ramp source 6 outputs a ramp signal the potential of which increases with time. When CNT_EN is set to High, the counter circuit 7 starts the count operation and performs the count operation in parallel with the change of the ramp signal.

For the ramp signal, the potential may continuously increase with time or may change in a saw form. In the former case, the potential change may become slow when the potential rises.

The level of the pixel signal when low-luminance light is incident is lower than the level of the pixel signal when high-luminance light is incident. Therefore, the magnitude relation between the potentials of the pixel signal and the ramp signal (the potential of which increases with time) for low-luminance incident light is inverted at an earlier timing than the magnitude relation for high-luminance incident light.

Assume that, when low-luminance light is incident, the magnitude relation between the potentials of the pixel and the ramp signals is inverted at time T2. At the same time, the output of the comparator circuit 3 changes from Low to High. When the output of the comparator circuit 3 changes from Low to High, the column memories 4 store a count value M (M is an integer) at this time.

Since the level of the pixel signal when high-luminance light is incident is higher than the level of the pixel signal when low-luminance light is incident, the magnitude relation between the potentials of the pixel and the ramp signals is inverted later than time T2. The magnitude relation between the two potentials when high-luminance light is incident is inverted at time T3. At time T3, the output of the comparator circuit 3 changes from Low to High, and the column memories 4 store a count value N (N is an integer, N>M) at this time.

At time T4, RAMP_EN and CNT_EN are set to Low, and the potential of the output signal of the ramp source 6 stops increasing and returns to a reference potential. The reference potential refers to a potential at the timing when the potential of the ramp signal starts rising. The counter circuit 7 ends the count operation. The above-described operation implements the AD conversion. The circuit used for the AD conversion is referred to as an AD conversion circuit.

With the above-described AD conversion method, the output of the comparator circuit 3 changes from Low to High at a later timing when higher luminance light is incident. More specifically, the column memory 4 stores a larger count value when higher luminance light is incident.

The timing chart illustrated in FIG. 2 is to be considered as illustrative, and the present exemplary embodiment is not limited thereto.

(Drive in Present Exemplary Embodiment)

Drive according to the present exemplary embodiment will be described below with reference to FIGS. 3A, 3B, and 4.

Figure 3A:
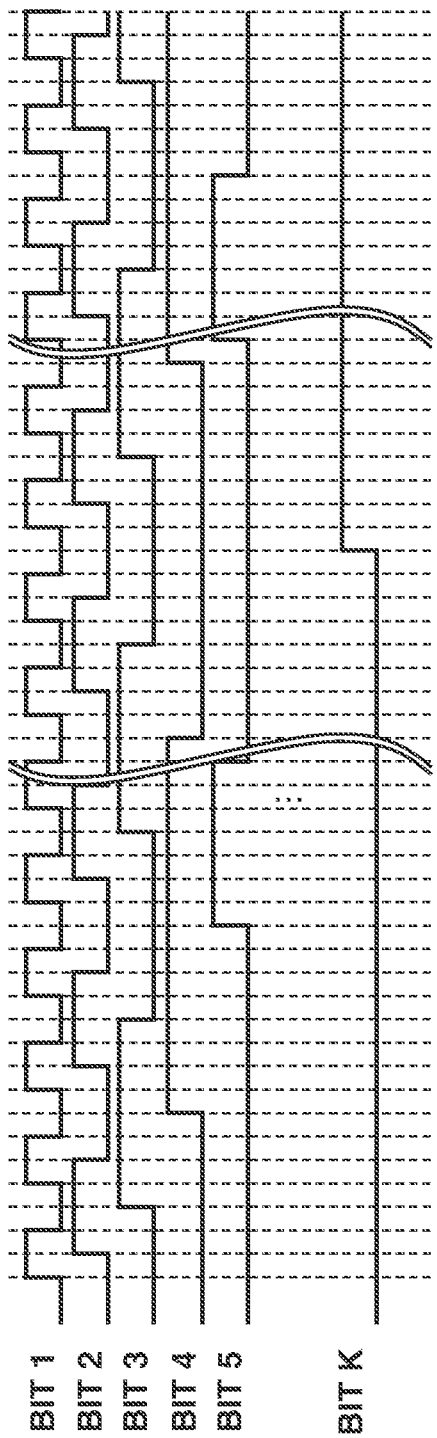
FIGS. 3A and 3B are timing charts illustrating an operation of each bit of a count value.
Figure 3B:
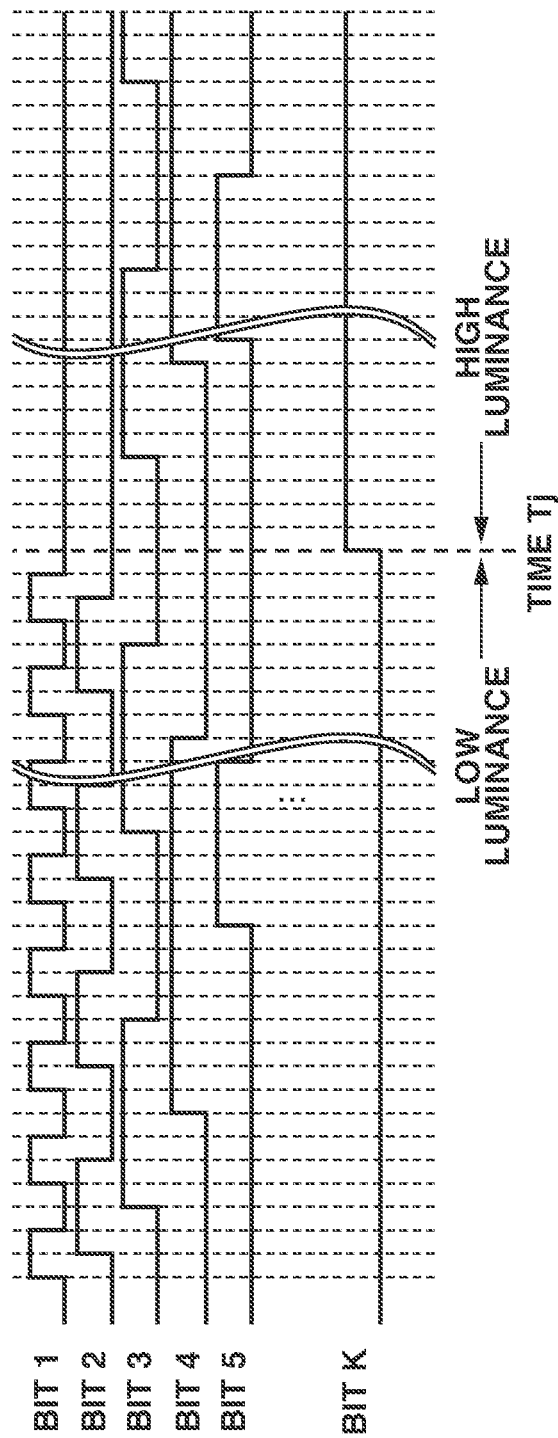

FIGS. 3A and 3B are timing charts illustrating the operation of each bit input to each column memory 4 when a K-bit gray code counter (K is an integer) is used as the counter circuit 7. FIG. 3A is a timing chart in a case where the resolution of the AD conversion is fixed regardless of the luminance. FIG. 3B is a timing chart in a case where the operations of the lower bits are deactivated in the high-luminance region according to the present exemplary embodiment. Referring to FIG. 3B, low-luminance light is incident when the output of the comparator circuit 3 is inverted during a first period before time Tj when bit K of the counter circuit 7 changes from Low to High, and high-luminance light is incident when the output of the comparator circuit 3 is inverted during a second period after time Tj.

Figure 4:
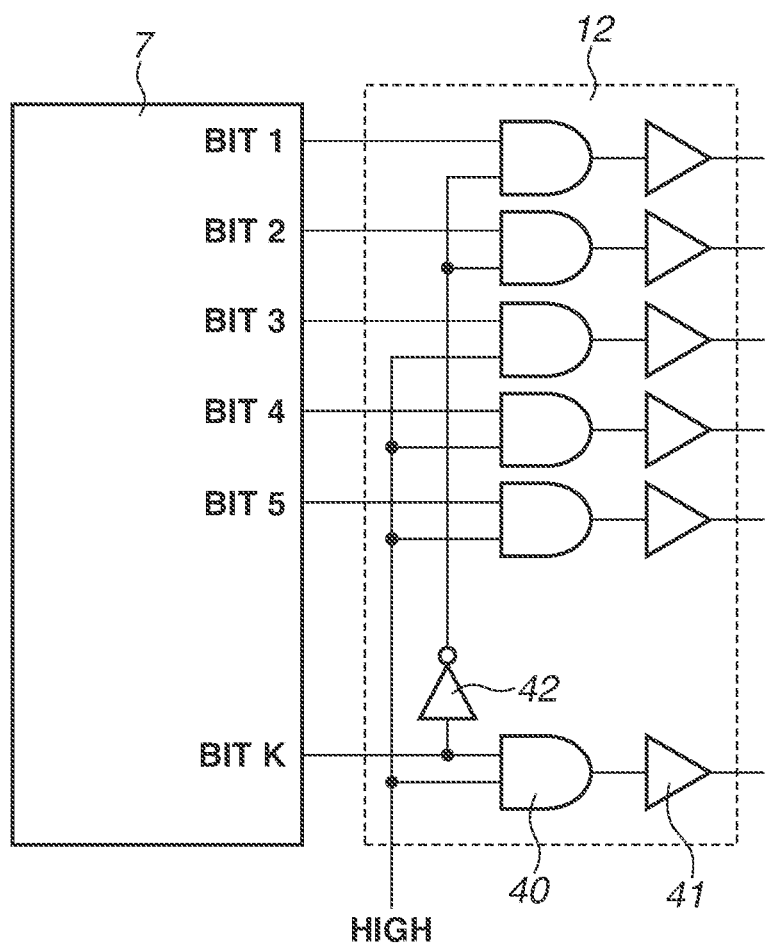
FIG. 4 illustrates an example configuration including a counter circuit and a gating circuit according to the first exemplary embodiment.

FIG. 4 illustrates an example configuration including the counter circuit 7 and the gating circuit 12 that implement the operations in the timing chart illustrated in FIG. 3B.

The gating circuit 12 includes AND circuits 40 each of which is connected to each of the output bits of the counter circuit 7, buffer circuits 41 respectively connected to the AND circuits 40, and an inverter circuit 42. As illustrated in FIG. 4, the outputs of the buffer circuits 41 provide the output of the gating circuit 12. A High-level signal is input to the other input terminals of the AND circuits 40 for bits 3 to K. The output signal of bit K of the counter circuit 7 inverted by the inverter circuit 42 is input to the other input terminals of the AND circuits 40 for bits 1 and 2. When bit K of the counter circuit 7 is High, the outputs of the AND circuits 40 for bits 1 and 2 are fixed to Low, and the outputs of the buffer circuits 41 connected to the AND circuits 40 for bits 1 and 2 are also fixed to Low. Other bits (bits 3 to K) for which a High signal is input to the AND circuits 40 output the respective outputs of the counter circuit 7 via the buffer circuits 41 regardless of the luminance. The power voltage to be used in the gating circuit 12, for example, may be connected to the High signal.

Configuring the gating circuit 12 as described above enables implementing the operations illustrated in the timing chart in FIG. 3B. The gating circuit 12 illustrated in FIG. 4 subjects bits 1 and 2 to gating on the high luminance side, and hence the buffer circuits 41 for bits 1 and 2 in the subsequent stages do not operate. Therefore, the operations in the timing chart illustrated in FIG. 3B according to the present exemplary embodiment provide lower power consumption than the operations in the timing chart illustrated in FIG. 3A where the gating circuit 12 and the buffer circuit 13 for all bits operate regardless of the luminance. In other words, the second period during which the count processing is performed at a low speed provides lower power consumption than the first period during which the count processing is performed at a high speed.

On the lower bit side, the number of operations in the gating circuit 12 and the buffer circuit 13 is larger than the number of operations therein on the higher bit side, providing a larger effect of power reduction when operations are deactivated.

Although two bits on the least significant bit side are subjected to gating, the AND circuits 40 are disposed for all bits to provide uniform delay amounts. The AND circuits 40 may be configured as a combination of other logic circuits.

Figure 5:
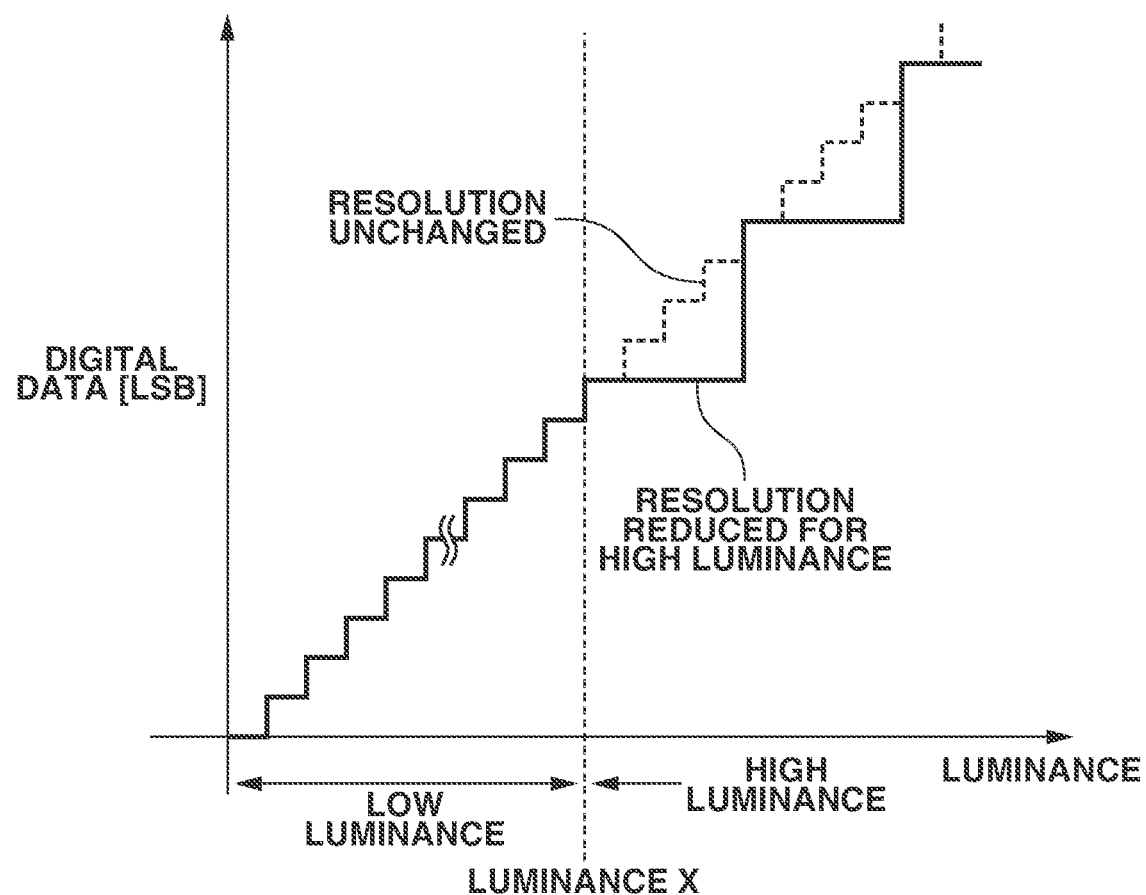
FIG. 5 illustrates a relation between a luminance and a resolution of AD conversion according to the first exemplary embodiment.

FIG. 5 illustrates the luminance of light incident to the photoelectric conversion apparatus and digital data corresponding to the luminance.

Referring to FIG. 5, the luminance equal to or higher than the luminance X is referred to as high luminance, and the luminance equal to or lower than the luminance X is referred to as low luminance Solid lines indicate changes of the digital data when high-luminance light is incident according to the present exemplary embodiment while dotted lines indicate changes of the digital data according to the prior art. The resolution of the AD conversion in the low-luminance region is identical for both the present exemplary embodiment and the prior art.

Referring to FIG. 5, the lower 2 bits of the counter circuit 7 are subjected to gating in the high-luminance region, like FIGS. 3B and 4. Since the lower 2 bits of the counter circuit 7 are subjected to gating, a 4-gradation luminance change drawn with dotted lines is equivalent to a 1-gradation luminance change drawn with solid lines, in the high-luminance region.

Generally, a captured image with low luminance presents higher visibility to luminance changes than a captured image with high luminance Therefore, in the high-luminance region where a resolution change is difficult to be visually recognized, reducing the resolution has a little effect on the image quality. Thus, according to the present exemplary embodiment, the power consumption can be reduced while restricting the influence on the image quality.

The present exemplary embodiment makes it possible to divide the luminance region into at least two arbitrary regions and set different resolutions in respective luminance regions. A method for dividing the luminance region and the resolution can be set depending on the required image quality.

Figure 6:
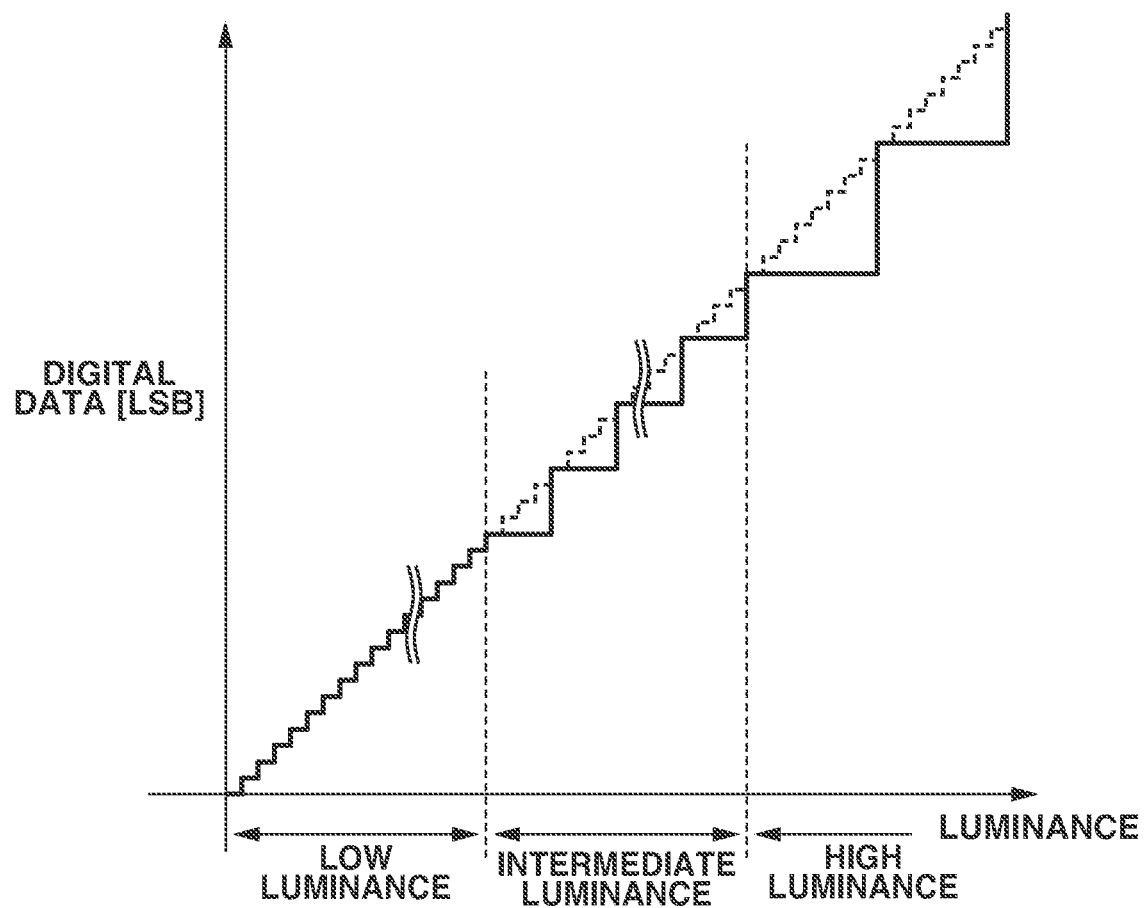
FIG. 6 illustrates another relation between the luminance and the resolution of the AD conversion according to the first exemplary embodiment.

FIG. 5 illustrates the division of the luminance region into two different regions: a low-luminance region and a high-luminance region. FIG. 6 illustrates the division of the luminance region into three different regions: a low-luminance region, an intermediate-luminance region, and a high-luminance region with different resolution settings.

Referring to FIG. 6, in the intermediate-luminance and the high-luminance regions, dotted lines indicate changes of the digital data in a case where the resolution remains unchanged since low-luminance light is incident whereas solid lines indicate changes of the digital data in a case where the resolution is changed. In this example, the lower 2 bits of the counter circuit 7 are subjected to gating in the intermediate-luminance region, the lower 3 bits of the counter circuit 7 are subjected to gating in the high-luminance region, thus preventing the operations of the bits subjected to gating. Therefore, a 1-gradation change in the intermediate-luminance region is equivalent to a 4-gradation change in the low-luminance region, and a 1-gradation change in the high-luminance region is equivalent to an 8-gradation change in the low-luminance region.

Figure 7:
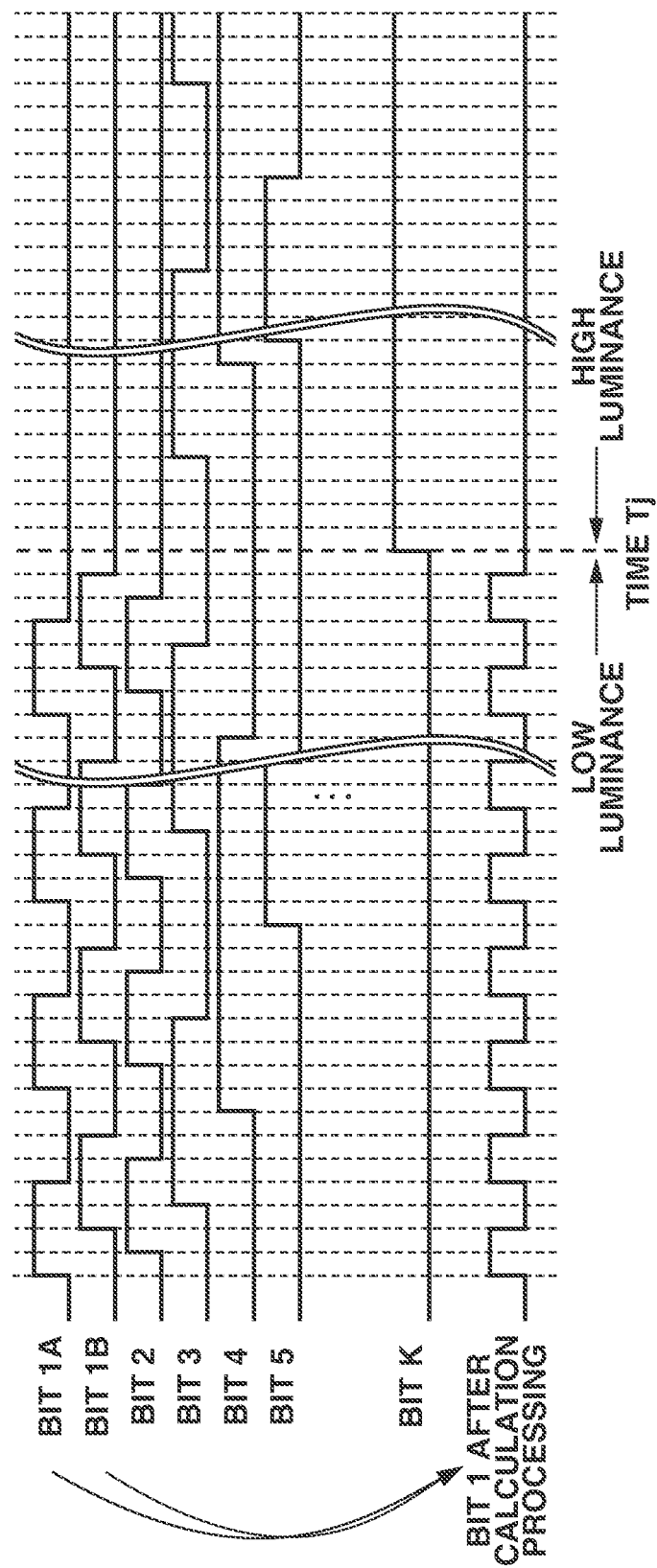
FIG. 7 is a timing chart illustrating an example operation of each bit of the count value according to the first exemplary embodiment.

Although, in the above-described examples, a general gray code counter is used as the counter circuit 7, the present exemplary embodiment is also applicable to a counter that operates according to the timing chart illustrated in FIG. 7.

Referring to the timing chart illustrated in FIG. 7, the signal for bit 1 is replaced with two signals for bits 1 A and 1 B having different phases. Bit 2 and subsequent bits operate in a similar way to those in a general gray code counter. For signals for bits 1 A and bit 1 B having different phases, the levels corresponding to the inversion of the output signal of the comparator circuit 3 are stored in the column memories 4 as they are. In the calculation processing of the calculation processing circuit 8, the signal of bit 1 can be generated by preforming processing for obtaining the exclusive OR (EXOR) of bits 1 A and 1 B stored in the column memories 4. For example, the operations in the timing chart illustrated in FIG. 7 can be suitably used in a case where, for example, the counter circuit 7 operates at a high operating frequency making circuit operation difficult.

Although, in FIG. 7, only bit 1, which is the least significant bit, is substituted by signals having different phases, the present exemplary embodiment is not limited thereto. A plurality of bits can be replaced with a plurality of signals having different phases, and the plurality of the bits may be generated in the calculation processing.

Although the gating circuits 12 are connected to the output of the counter circuit 7 to deactivate the operations of the plurality of bits by using the gating circuits 12, the present exemplary embodiment is not limited thereto. For example, count operations of the plurality of lower bits may be deactivated in the counter circuit 7. In this case, the gating circuits 12 do not need to be disposed.

Figure 8:
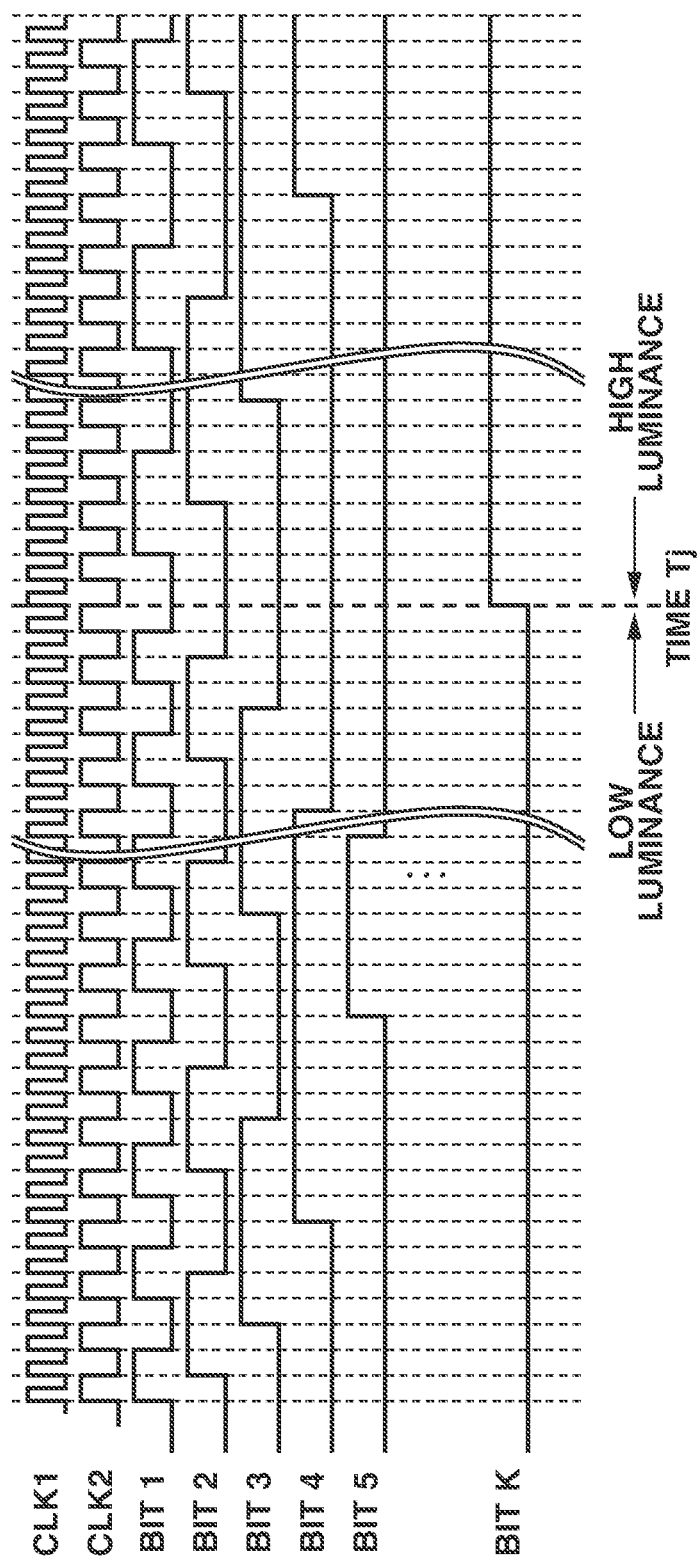
FIG. 8 is a timing chart illustrating another example operation of each bit of the count value according to the first exemplary embodiment.

The timing chart illustrated in FIG. 8 is an example where the counter circuit 7 is supplied with a high-frequency clock CLK1 and a low-frequency clock CLK2.

Referring to the timing chart in FIG. 8, like FIGS. 3A and 3B, the luminance region is divided into a low-luminance region and a high-luminance region centering on time Tj when bit K of the counter circuit 7 changes from Low to High. The counter circuit 7 performs the count operation in synchronization with CLK1 in the low-luminance region, and performs the count operation in synchronization with CLK2 in the high-luminance region. Referring to the example in FIG. 8, the frequency of CLK2 is a half of the frequency of CLK1, and the counter circuit 7 is a gray code counter.

In this configuration, in a case where the AD conversion is completed before time Tj, the calculation processing is performed as it is and digital data corresponding to an acquired count value can be obtained.

On the other hand, in a case where the AD conversion is completed after time Tj, adding the doubled value of the digital data corresponding to the count values of bits 1 to (K−1) and the value of bit K, $2^{(K-1)}$, enables obtaining the digital data of bit K with a reduced resolution.

Referring to the example illustrated in FIG. 8, the operating frequency of the counter circuit 7 decreases in the high-luminance region, and the operating frequencies of the buffer circuits 13 connected to the subsequent stage of the counter circuit 7 also decrease, making it possible to reduce the power consumption like a conventional case.

Referring to the timing chart in FIG. 8, since the resolution is reduced inside the counter circuit 7, the gating circuits 12 do not need to be disposed.

Although the above descriptions have been made on the premise that the counter circuit 7 is a gray code counter, the counter circuit 7 is not limited to a gray code counter but may be, for example, a binary counter if applicable. One counter circuit 7 is disposed for entire columns of the column memories 4, one counter circuit 7 may be disposed for a plurality of columns of the column memories 4.

Although the above descriptions have been made on the premise that the lower bits are fixed to Low on the high-luminance side, the present exemplary embodiment is not limited thereto. For example, the lower bits may be fixed to High, or fixed to an intermediate potential if possible.

Gating is performed by using the signal of a certain one bit of the outputs of the counter circuit 7, the present exemplary embodiment is not limited thereto. A gate signal may be generated by using signals of a plurality of bits.

According to the present exemplary embodiment, the first period indicates the period before time Tj and the second period indicates the period after time Tj, and the first period and the second period are uninterrupted time periods. A third period during which the counter is deactivated may be provided, for example, as a period since the first period has elapsed until the second period starts.

A second exemplary embodiment will be described below with reference to FIGS. 9 to 12.

Figure 9:
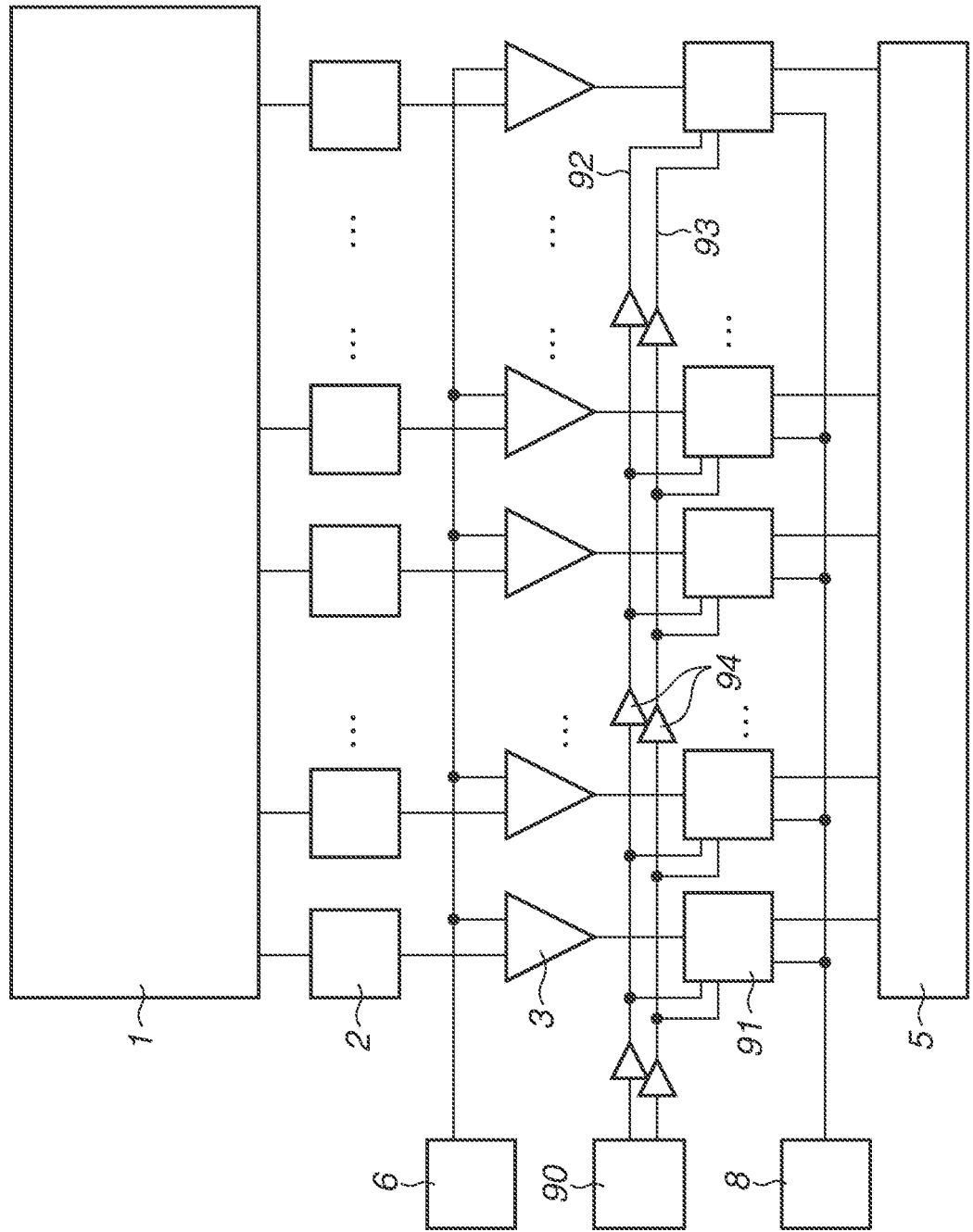
FIG. 9 schematically illustrates a configuration of the photoelectric conversion apparatus according to a second exemplary embodiment.

FIG. 9 describes the photoelectric conversion apparatus according to the present exemplary embodiment. Referring to FIG. 9, elements identical to those in FIG. 2 are assigned the same reference numerals, and redundant descriptions thereof will be omitted. The following description will be made centering mainly on differences from the first exemplary embodiment.

In the photoelectric conversion apparatus in FIG. 9, the counter circuit 7 and the column memories 4 in FIG. 1 are replaced with a CLK generation circuit 90 and column counter circuits 91, respectively.

Each column counter circuit 91 is connected with a CLK wiring 92 that transfers a high-frequency clock, and a CLK wiring 93 that transfers a low-frequency clock. Clock buffer circuits 94 are disposed on the CLK wirings 92 and 93 at intervals of a plurality of columns.

Figure 10:
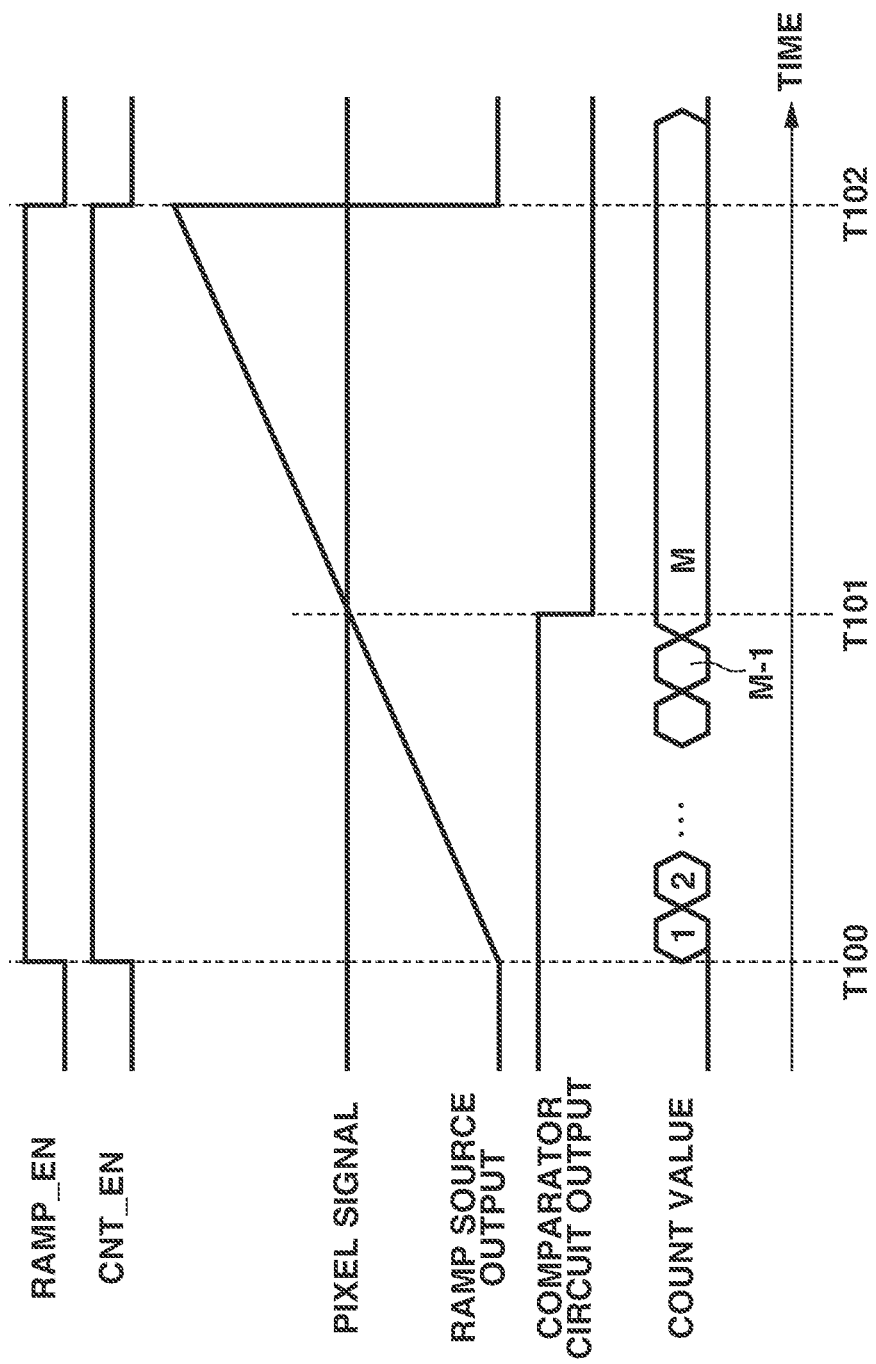
FIG. 10 is a timing chart illustrating the AD conversion operation of the photoelectric conversion apparatus.

FIG. 10 illustrates a timing chart of the AD conversion operation according to the present exemplary embodiment.

For the portions described above with reference to FIG. 2, detailed descriptions will be omitted. Like FIG. 2, the potential of the pixel signal increases with increasing luminance of incident light due to the processing of the read circuit 2. When the potential of the ramp signal is larger than the potential of the pixel signal, the output of the comparator circuit 3 is Low.

At time T100, the control signals RAMP_EN and CNT_EN change from Low to High, the output of the ramp signal having a time-varying potential is started, and the column counter circuit 91 starts the count operation.

At time T101, the magnitude relation between the potentials of the ramp and the pixel signals input to the comparator circuit 3 is inverted, and the output of the comparator circuit 3 changes from High to Low. At this timing, the column counter 91 completes the count operation and holds the count value M (M is an integer) at that time to implement the AD conversion. Subsequently, the column counter 91 transfers data to the calculation processing circuit 8 that performs calculation processing.

Figure 11:
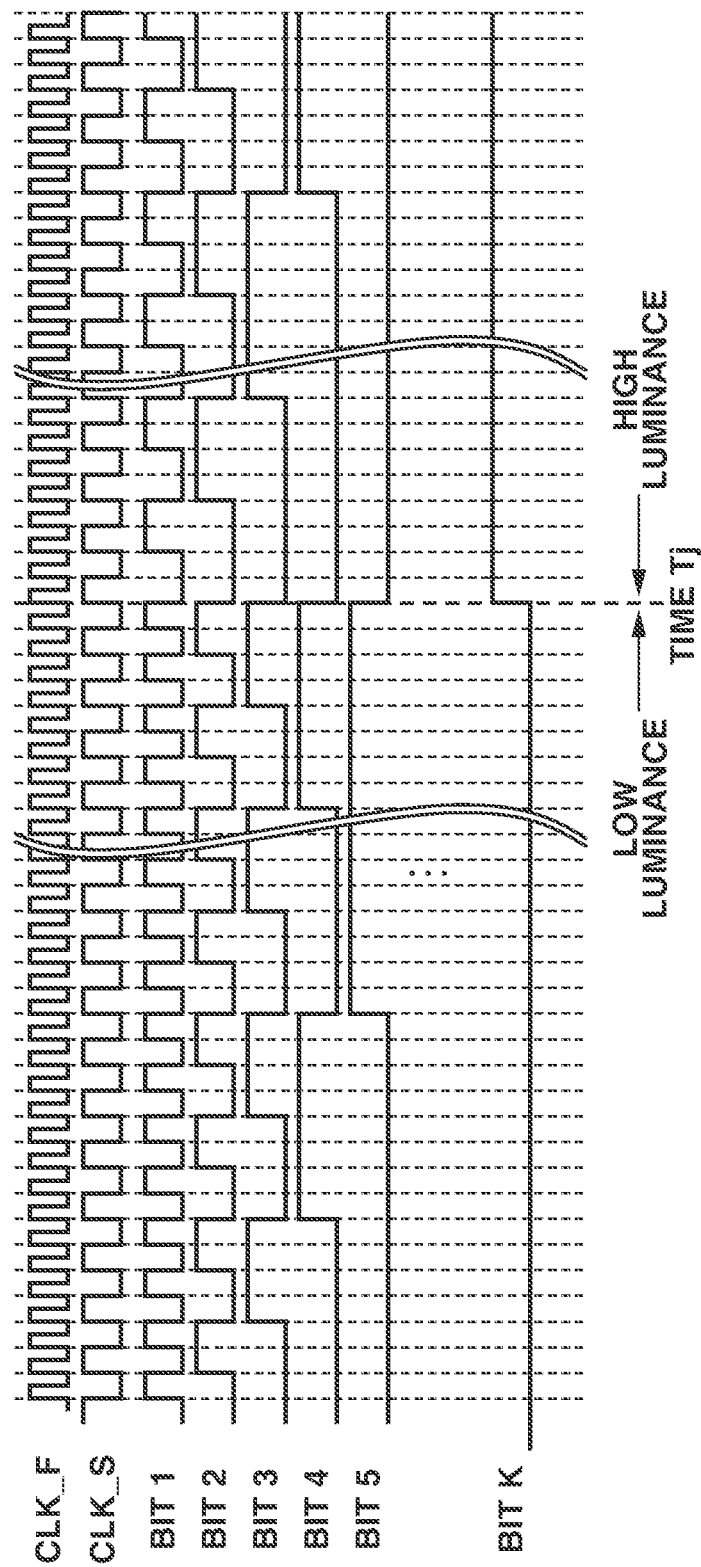
FIG. 11 is a timing chart illustrating an operation of a column counter according to the second exemplary embodiment.

FIG. 11 is a timing chart illustrating the operation of the column counter 91 according to the present exemplary embodiment.

The column counter 91 is configured as a binary counter to which a high-frequency clock CLK_F and a low-frequency clock CLK_S are input. Referring to FIG. 11, the frequency of CLK_S is a half of the frequency of CLK_F. Low-luminance light is incident when the output of the comparator circuit 3 is inverted before time Tj when bit K of the counter circuit 7 changes from Low to High, and high-luminance light is incident when the output of the comparator circuit 3 is inverted after time Tj.

In a case where the luminance of incident light belongs to the low-luminance region, the column counter 91 performs the count operation in synchronization with CLK_F of the two clocks input to the column counter 91. In a case where the luminance of incident light belongs to the high-luminance region, the column counter 91 performs the count operation in synchronization with CLK_S.

In a case where the AD conversion is completed before time Tj, the held count value becomes digital data as it is. In a case where the AD conversion is completed after time Tj, adding the doubled value of the digital data corresponding to the count values of bits 1 to (K−1) and the value of bit K, $2^{(K-1)}$, enables obtaining the digital data of bit K with a reduced resolution.

Figure 12:
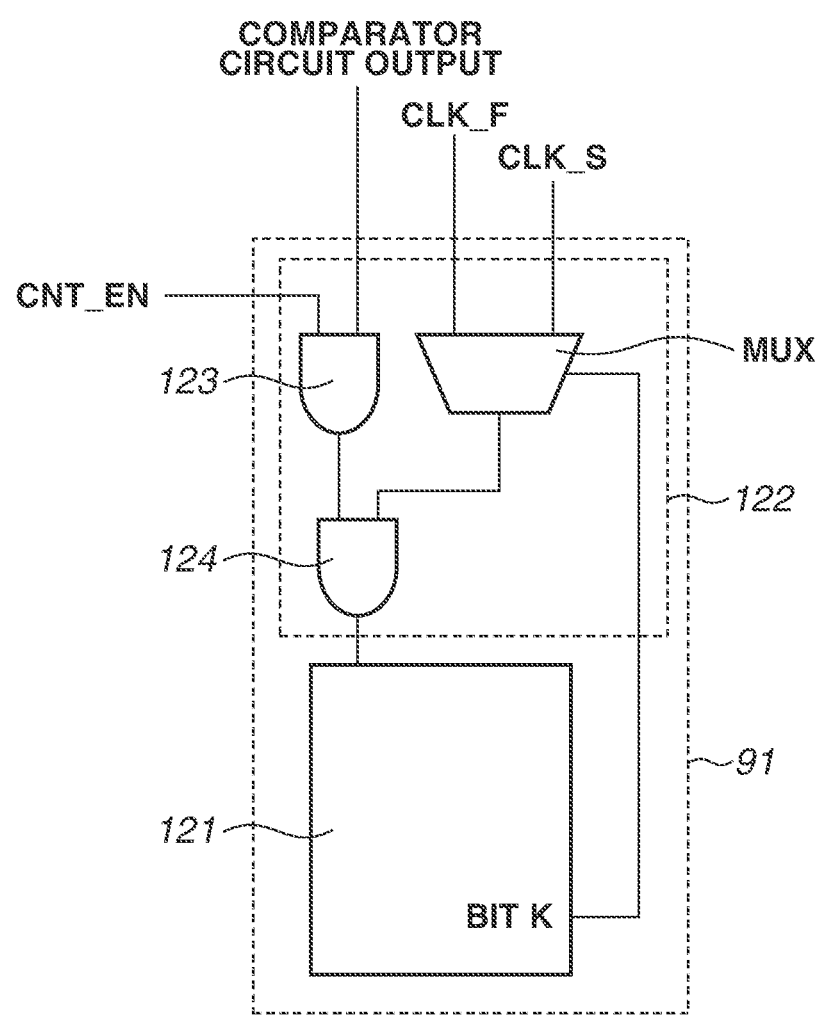
FIG. 12 illustrates an example of a circuit configuration of the column counter according to the second exemplary embodiment.

FIG. 12 illustrates an example of the column counter 91 that implements the operations in the timing chart illustrated in FIG. 11.

The column counter 91 includes a column counter circuit 121 and a clock gate circuit 122.

The clock gate circuit 122 includes a multiplexer MUX and 2-input AND circuits 123 and 124.

The signal CNT_EN and the output of the comparator circuit 3 are input to the AND circuit 123.

The high-frequency clock CLK_F and the low-frequency clock CLK_S are input to the multiplexer MUX, and further the output of bit K of the column counter circuit 121 is input to the multiplexer MUX as a control input. The multiplexer MUX outputs CLK_F in a case where bit K of the column counter circuit 121 is Low and outputs CLK_S in a case where bit K is High.

The output of the multiplexer MUX and the output of the AND circuit 123 are input to the AND circuit 124. The column counter circuit 121 is supplied with an operation clock via the AND circuit 124.

Referring to the circuit in FIG. 12, CLK_F is supplied to the column counter 91 when the output of the comparator circuit 3 is High, the signal CNT_EN is High, and bit K of the column counter circuit 121 is Low.

On the other hand, CLK_S is supplied to the column counter 91 when the output of the comparator circuit 3 is High, the signal CNT_EN is High, and bit K of the column counter circuit 121 is High.

The circuit illustrated in FIG. 12 is an example of the column counter 91, but the configuration is not limited thereto.

According to the above descriptions, the photoelectric conversion apparatus having the column counter 91 enables reducing the power consumption by reducing the resolution. As described above, the influence on the image quality is small since the resolution is reduced in the high-luminance region where luminance changes are difficult to be visually recognized.

Although the above descriptions have been made on the premise that two different clocks are input to the column counter 91, the present exemplary embodiment is not limited thereto. For example, only one clock may be input to the column counter 9 and the other clock may be generated in the column counter 9. Further, three or more different clocks may be input to the column counter 9. For example, in a case where three different clocks are used, the luminance region can be divided into a high-luminance region, an intermediate-luminance region, and a low-luminance region as illustrated in FIG. 6, and a resolution can be set for each region.

Although, in the exemplary embodiment, gating is performed by using the signal of a certain one bit of the output signal of the column counter circuit 121, a gate signal may be generated by using the signals of a plurality of bits.

A third exemplary embodiment will be described below with reference to FIGS. 13 to 15.

Figure 13:
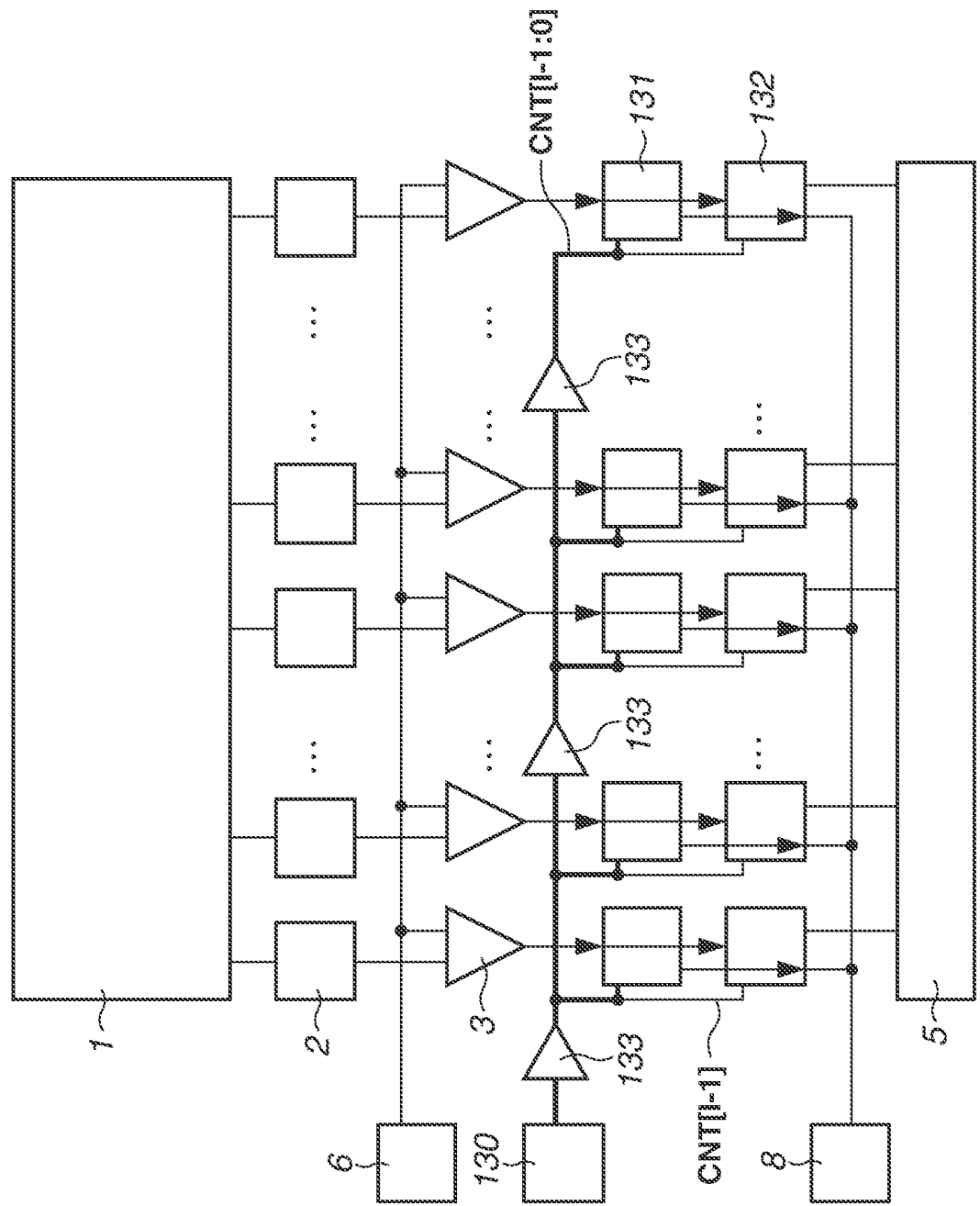
FIG. 13 schematically illustrates a configuration of the photoelectric conversion apparatus according to a third exemplary embodiment.

FIG. 13 illustrates the photoelectric conversion apparatus according to the present exemplary embodiment. For the portions having been described above, detailed descriptions will be omitted. Portions different from the first and the second exemplary embodiments will be described below.

The photoelectric conversion apparatus illustrated in FIG. 13 includes a column memory 131 and a column counter 132 for each column of the pixel array. A count value CNT[I−1:0] of bit I (I is an integer) generated by the common counter 130, is input to the column memory 131 via a buffer circuit 133. A signal CNT[I−1] of the most significant bit of the count value of bit I is input to the column counter 132.

The common counter 130 starts operating when the AD conversion is started. The column counter 132 counts the number of input pulses of the signal CNT[I-1] generated by the common counter 130. When the magnitude relation between the potentials of the ramp and the pixel signals is inverted and the output of the comparator circuit 3 is inverted, the column memory 131 stores the count value CNT[I−1:0]. The column counter 132 deactivates the count operation and holds its own count value.

Referring to the example in FIG. 13, the lower bits of the digital data having been subjected to the AD conversion are generated from the count value of the common counter 130, and the higher bits thereof are generated from the count value of the column counter 132. Upon completion of the AD conversion, the data of the lower bits stored in the column memory 131 and the data of the higher bits held by the column counter 132 are transferred to the calculation processing circuit 8. The calculation processing circuit 8 performs the calculation processing to generate digital data.

Figure 14:
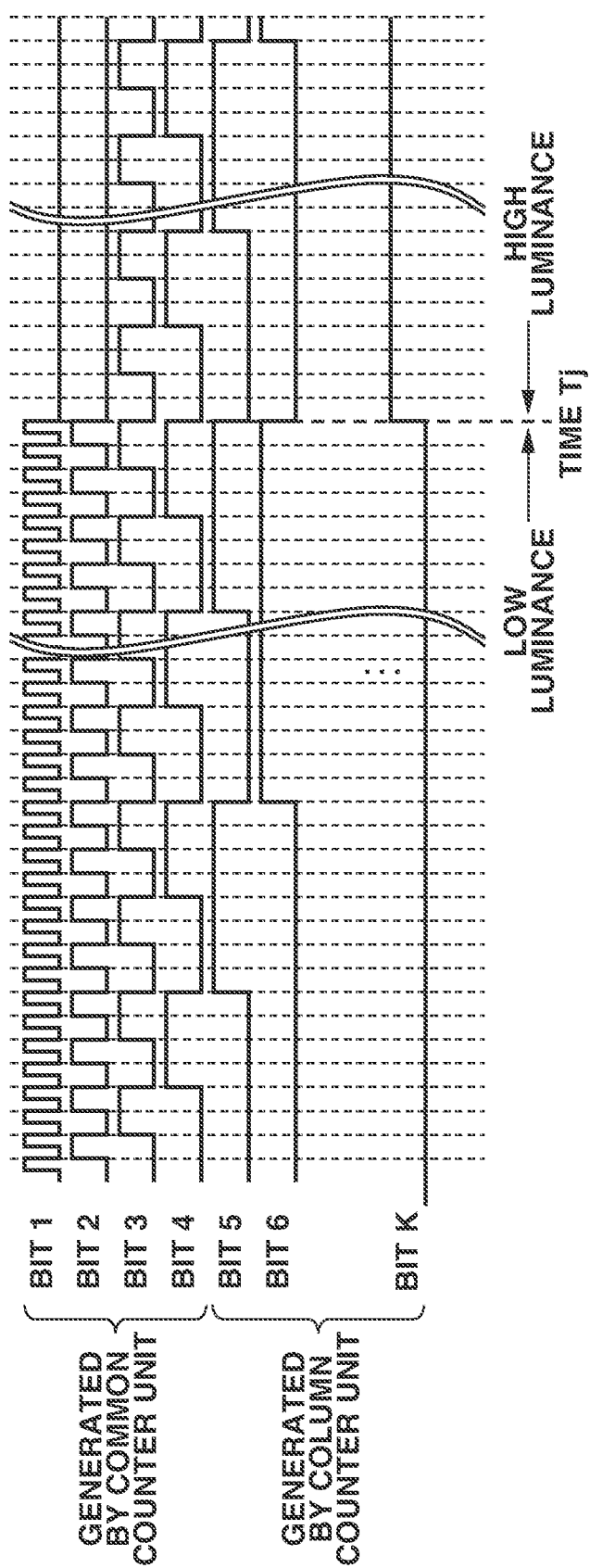
FIG. 14 is a timing chart illustrating still another example operation of each bit of the count value according to the third exemplary embodiment.

FIG. 14 is a timing chart illustrating the operations of the common counter 130 and the column counter 132 in a case where the present exemplary embodiment is applied to the photoelectric conversion apparatus in FIG. 13. To simplify the description, the common counter 130 is assumed to generate a count value, as a binary counter.

According to the present exemplary embodiment, the lower 4 bits of the digital data are counted by the common counter 130, and the higher bits thereof are counted by the column counter 132. The clock input to the column counter 132 is an inverted signal of the signal of bit 4 output from the common counter 130. Therefore, the column counter 132 operates in synchronization with the falling edge of bit 4 output from the common counter 130. At time Tj, bit K is set to High, and the lower 2 bits are fixed by this signal. After time Tj, the lower 2 bits are fixed until the AD conversion ends.

Figure 15:
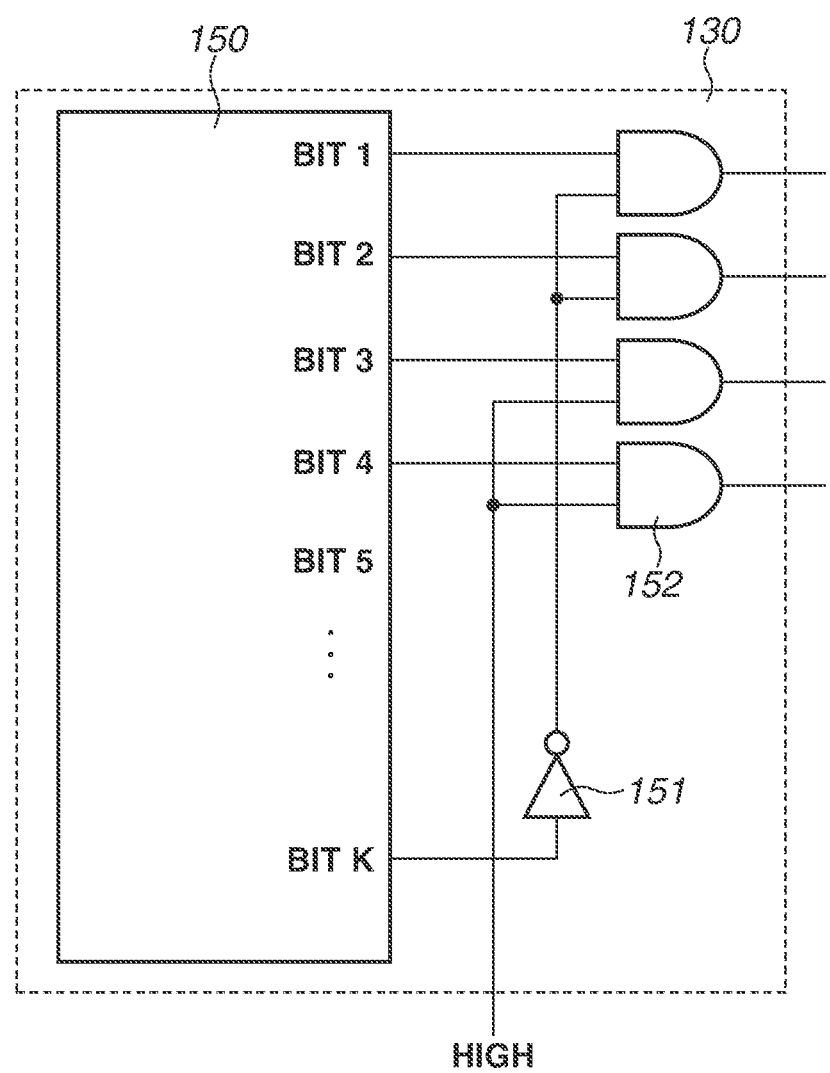
FIG. 15 illustrates an example of a configuration of a common counter that implements timing charts according to the third exemplary embodiment.

FIG. 15 illustrates an example of the common counter 130 that implements the operations in the timing chart illustrated in FIG. 14.

Referring to the example in FIG. 15, the common counter 130 includes a K-bit counter circuit 150, an inverter circuit 151, and four AND circuits 152. The counter circuit 150 is a K-bit counter, and only lower 4 bits are output from the common counter 130.

When bit K of the counter circuit 150 is High, the signal inverted to Low by the inverter circuit 151 is input to the AND circuits 152 of bits 1 and 2. Therefore, after time Tj when bit K is High, the outputs of bits 1 and 2 are fixed to Low. Since High is input to the AND circuits 152 of bits 3 and 4, bits 3 and 4 are output as they are from the common counter 130 also after time Tj. Only lower 4 bits are output from the common counter 130. A K-bit counter is used as the counter circuit 150 so that the signal of bit K is used as a gate signal for the lower 2 bits. Although bits 3 and 4 do not need to be subjected to gating, the AND circuit 152 is also disposed for bits 3 and 4 to provide uniform delay amounts for all of the 4 output bits.

As described above, according to the present exemplary embodiment, fixing the lower bits of the common counter 130 to Low in the high-luminance region disables the operations of the buffer circuits 133 of the lower bits having been subjected to gating, thus reducing the power consumption. As described above, the influence on the image quality is small since the resolution is reduced in the high-luminance region where luminance changes are difficult to be visually recognized. Therefore, applying the present exemplary embodiment enables reducing the power consumption while restricting the image quality degradation.

Although, in the present exemplary embodiment, the common counter 130 is assumed to generate a count value as a binary counter, the present exemplary embodiment is not limited thereto. The common counter 130 may be, for example, a gray code counter.

Although the counter circuit 150 is a K-bit counter, it may be, for example, a 4-bit counter. The signal of bit K may be supplied from the column counter 132 to the common counter 130, and the signal may be used as a gate signal.

Although the above descriptions have been made on the premise that the lower 2 bits are subjected to gating in the timing chart in FIG. 15, the lower 1 bit or lower 3 bits or more may be subjected to gating. As described above with reference to the timing chart in FIG. 7, the signals of the lower bits may be generated by shifting the phases of a plurality of signals.

Although the present exemplary embodiment has been described above centering on a configuration in which the lower bits are subjected to gating, the operating frequency of the counter may be different between the low-luminance and the high-luminance regions.

Although the counter is subjected to gating by using the signal of a certain one bit of the counter circuit 150, the present exemplary embodiment is not limited thereto. A gate signal may be generated by using signals of a plurality of bits. A gate signal may be generated by using the plurality of bits of the output signal of the column counter 132.

Although the first to the third exemplary embodiments have been described above on the premise that the potential of the pixel signal output from the read circuit 2 increases according to the luminance of the incident light, the present exemplary embodiment is not limited thereto. The potential may be configured to decrease according to the luminance. The read circuit 2 may be provided with an amplifier capable of applying a gain to an input signal. In this case, the amplifier may be an inverting amplifier or a non-inverting amplifier.

Although, in the first to the third exemplary embodiments, an output signal of the counter is used to change the gate for the lower bits and the operating frequency of the counter to be used for the AD conversion, the present exemplary embodiment is not limited thereto. For example, the present exemplary embodiment may be provided with a time measurement circuit in addition to the counter, and a certain bit may be subjected to gating or the operating frequency of the counter may be changed, by using a signal generated by the time measurement circuit.

The present exemplary embodiment performs the AD conversion for the reset and the pixel signals of the pixel to perform the above-described digital CDS, the present exemplary embodiment can be more suitably used at the time of the AD conversion for the pixel signal.

A known technique reads a first signal for focal distance detection and a second signal for image information from a pixel in a photoelectric conversion apparatus having a focal distance detection function. The present exemplary embodiment is also preferably applicable to such a technique. An example of a photoelectric conversion apparatus having a first pixel group for reading the first signal for focal distance detection and a second pixel group for reading the second signal for image information will be described below. For example, in such a photoelectric conversion apparatus, the resolution can be increased in the low-luminance region of the second signal as image information and decreased in the high-luminance region thereof. Since the first signal for focal distance detection is not used as image information, the first signal may not need to have a resolution comparable with the second signal. In this case, the resolution of the first signal can be made smaller than the resolution of the second signal.

As described above, setting the resolutions of the first and second signals according to the luminance of incident light enables reducing the power consumption also in a photoelectric conversion apparatus having a focal distance detection function.

It is possible to set whether to apply the present exemplary embodiment according to each image capture mode. For example, the resolution can be fixed regardless of the luminance in the static image capture mode requiring high image quality, and the resolution can be set depending on the luminance in the moving image capture mode. The luminance region and the resolution in the region can be set for each image capture mode.

Figure 16:
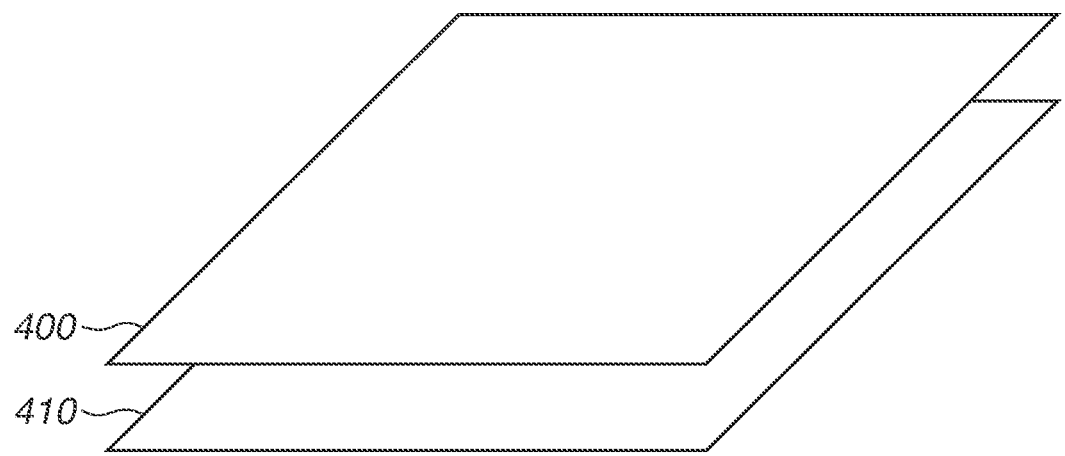
FIG. 16 schematically illustrates a photoelectric conversion apparatus having a layered structure.

The photoelectric conversion apparatus according to each exemplary embodiment may have a layered structure as illustrated in FIG. 16.

The photoelectric conversion apparatus having the layered structure illustrated in FIG. 16 includes a pixel board 400 and a circuit board 410. The pixel board 400 is provided with at least one pixel circuit1. Circuit components such as the comparator circuit 3, the column memories 4, the ramp source 6, and the counter circuit 7 are disposed on the circuit board 410. However, the arrangements of the circuit components are not limited to the circuit board 410. For example, the ramp source 6 and other circuit components may be disposed on the pixel board 400. Some of the circuit components may be disposed on the pixel board 400, and other circuit components may be disposed on the circuit board 410. A layered structure including two different boards is illustrated in FIG. 16. In the layered structure, for example, each circuit may be further divided, or three or more boards including additional circuits and functions may be disposed.

Figure 17:
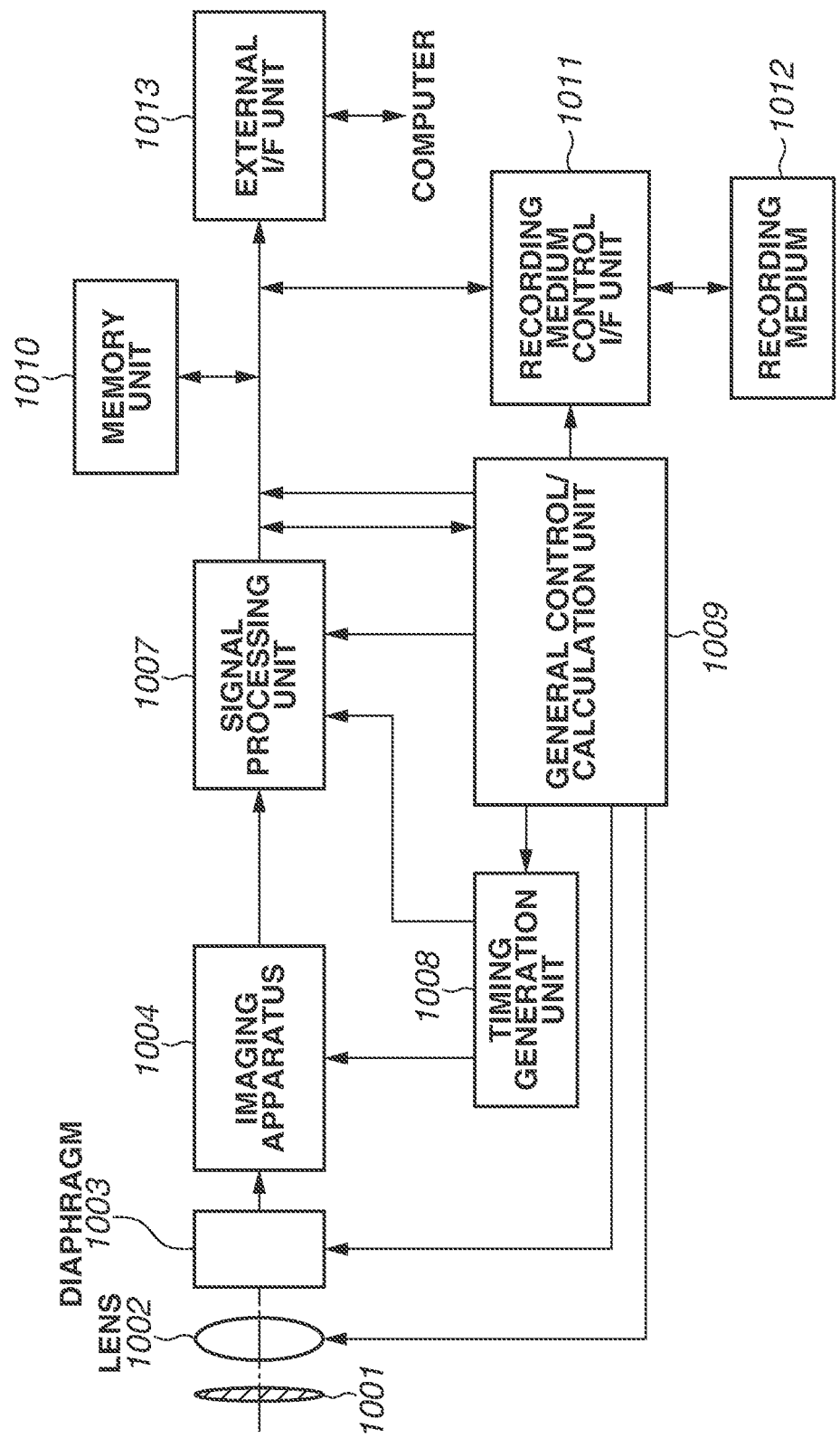
FIG. 17 illustrates a configuration of a photoelectric conversion system.

The photoelectric conversion system according to a fourth exemplary embodiment will be described below with reference to FIG. 17. FIG. 17 is a block diagram illustrating an overall configuration of the photoelectric conversion system according to the present exemplary embodiment.

The photoelectric conversion apparatuses (imaging apparatuses) according to the first to the third exemplary embodiments are applicable to various types of photoelectric conversion systems. Examples of applicable photoelectric conversion systems include digital still cameras, digital camcorders, monitoring cameras, copying machines, fax machines, mobile phones, on-vehicle cameras, and observation satellites. Camera modules having an optical system, such as lenses, and an imaging apparatus are included in photoelectric conversion systems. FIG. 17 is a block diagram illustrating a digital still camera as an example of a photoelectric conversion system.

The photoelectric conversion system illustrated in FIG. 17 includes an imaging apparatus 1004 as an example of a photoelectric conversion apparatus, and a lens 1002 that forms an optical image of a subject on the imaging apparatus 1004. The photoelectric conversion system further includes a diaphragm 1003 that varies the light quantity passing through the lens 1002, and a barrier 1001 that protects the lens 1002. The lens 1002 and the diaphragm 1003 form an optical system for condensing light to the imaging apparatus 1004. The imaging apparatus 1004 is a photoelectric conversion apparatus (imaging apparatus) according to either one of the above-described exemplary embodiments, and converts an optical image formed by the lens 1002 into an electrical signal.

The photoelectric conversion system further includes a signal processing circuit 1007 as an image generation circuit that generates an image by processing the output signal output from the imaging apparatus 1004. The signal processing circuit 1007 performs various types of correction and compression as required and outputs image data. The signal processing circuit 1007 may be formed on a semiconductor substrate on which the imaging apparatus 1004 is disposed, or formed on a semiconductor substrate different from the substrate of the imaging apparatus 1004.

The photoelectric conversion system further includes a memory circuit 1010 for temporarily storing image data, and an external interface (I/F) circuit 1013 for communicating with an external computer. The photoelectric conversion system further includes a recording medium 1012 such as a semiconductor memory for recording and reading image data, and a recording medium control interface (I/F) circuit for recording and reading image data to/from the recording medium 1012. The recording medium 1012 may be built in the photoelectric conversion system, or may be attachable to and detachable from the photoelectric conversion system.

The photoelectric conversion system further includes a general control/calculation circuit 1009 that performs various calculations and controls the entire digital still camera, and a timing generation circuit 1008 that outputs various timing signals to the imaging apparatus 1004 and the signal processing circuit 1007. In this case, timing signals may be input from the outside, and the photoelectric conversion system needs to include at least the imaging apparatus 1004, and the signal processing circuit 1007 that processes the output signal output from the imaging apparatus 1004.

The imaging apparatus 1004 outputs an imaging signal to the signal processing circuit 1007. The signal processing circuit 1007 subjects the imaging signal output from the imaging apparatus 1004 to predetermined signal processing and outputs image data. The photoelectric conversion system generates an image by using the image data.

As described above, the present exemplary embodiment makes it possible to implement a photoelectric conversion system that applies the photoelectric conversion apparatus (imaging apparatus) according to either one of the above-described exemplary embodiments.

Figure 18A:
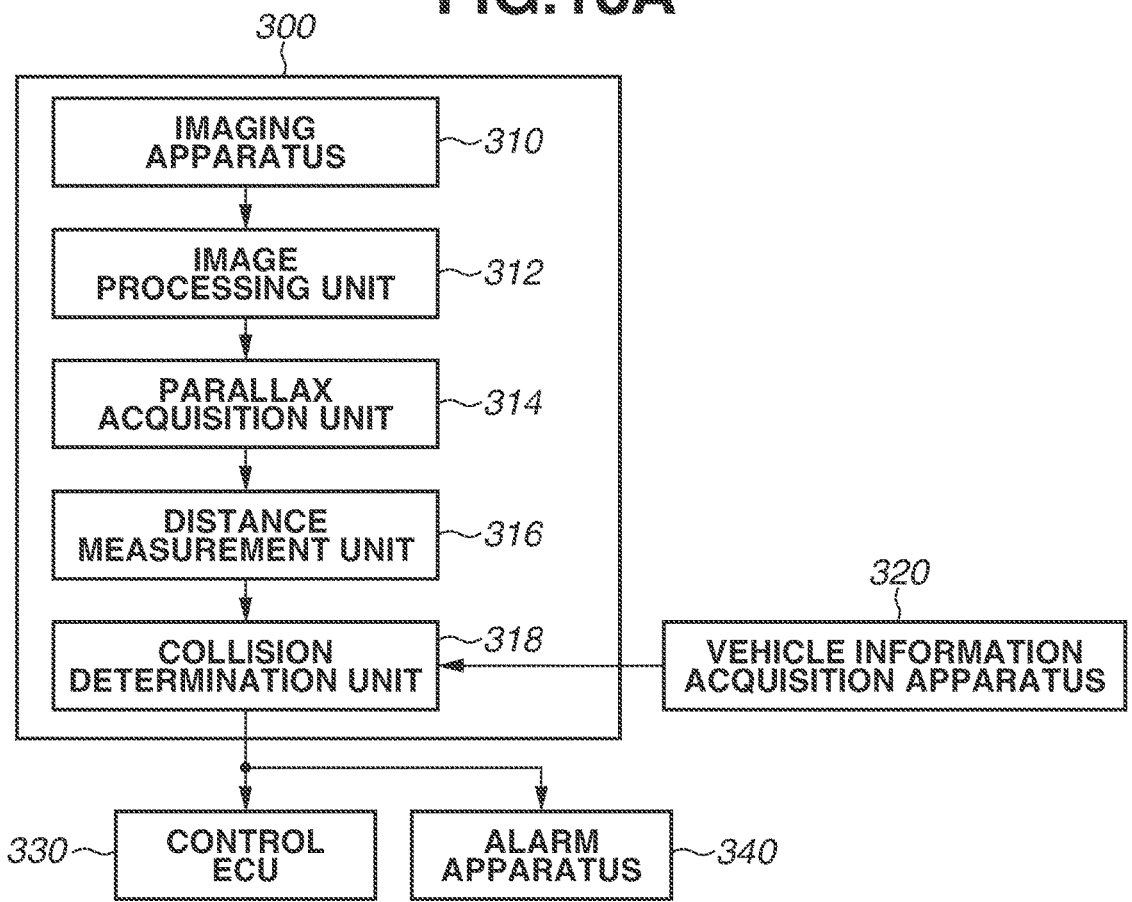
FIGS. 18A and 18B illustrate a configuration and an operation of a moving body.
Figure 18B:
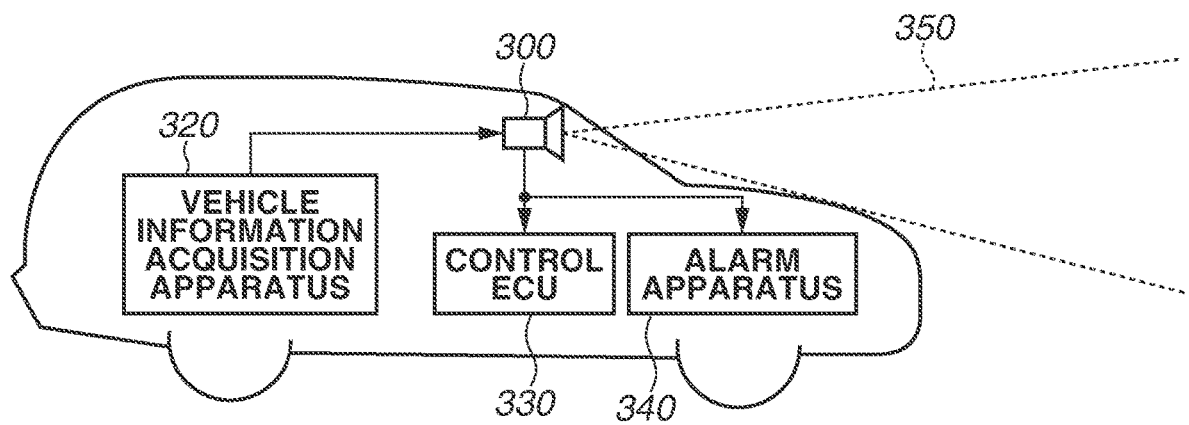

A photoelectric conversion system and a moving body according to a fifth exemplary embodiment will be described below with reference to FIGS. 18A and 18B. FIGS. 18A and 18B illustrate configurations of the photoelectric conversion system and the moving body according to the present exemplary embodiment.

FIG. 18A illustrates an example of a photoelectric conversion system related to an on-vehicle camera. A photoelectric conversion system 300 includes an imaging apparatus 310. The imaging apparatus 310 is the photoelectric conversion apparatus (imaging apparatus) according to either one of the above-described exemplary embodiments. The photoelectric conversion system 300 includes an image processing circuit 312 that subjects a plurality of image data pieces acquired by the imaging apparatus 310 to image processing, and a parallax acquisition circuit 314 that calculates the parallax (phase difference between parallax images) based on a plurality of image data pieces acquired by the photoelectric conversion system 300. The photoelectric conversion system 300 further includes a distance acquisition circuit 316 that calculates the distance to an object based on the calculated parallax, and a collision determination circuit 318 that determines the possibility of collision based on the calculated distance. In this case, the parallax acquisition circuit 314 and the distance acquisition circuit 316 are examples of distance information acquisition circuits that acquire information about the distance to the object. More specifically, the distance information is information about the parallax, the defocus amount, and the distance to the object. The collision determination circuit 318 may determine the possibility of collision by using either one of these pieces of distance information. The distance information acquisition circuit may be implemented by specially designed hardware or by a software module. The distance information acquisition circuit may also be implemented by a Field Programmable Gate Array (FPGA), an Application Specific Integrated Circuit (ASIC), or a combination of both.

The photoelectric conversion system 300 is connected with a vehicle information acquisition apparatus 320 and is capable of acquiring vehicle information such as the vehicle speed, yaw rate, and steering angle. The photoelectric conversion system 300 is connected with a control Electronic Control Unit (ECU) 330, which is a control apparatus that outputs control signals for generating a braking force on a vehicle based on a determination result by the collision determination circuit 318. The photoelectric conversion system 300 is also connected with an alarm apparatus 340 that generates an alarm to the driver based on a determination result by the collision determination circuit 318. For example, if the possibility of collision is determined to be high as a result of the determination by the collision determination circuit 318, the control ECU 330 performs vehicle control for avoiding a collision and reducing damages, for example, by applying the brake, releasing the accelerator, or restraining the engine power. The alarm apparatus 340 warns the driver by generating an alarm sound, displaying alarm information on the screen of the car navigation system, or applying a vibration to the seat belt or steering wheel.

According to the present exemplary embodiment, the photoelectric conversion system 300 captures images of the surrounding of the vehicle, for example, images ahead or behind the vehicle. FIG. 18B illustrates the photoelectric conversion system in a case where images ahead of the vehicle (imaging range 350) are to be captured. The vehicle information acquisition apparatus 320 transmits an instruction to the photoelectric conversion system 300 or the imaging apparatus 310. The above-described configuration enables improving the accuracy of distance measurement.

Although the present exemplary embodiment has been described above centering on vehicle control for avoiding a collision with other vehicles, the present exemplary embodiment is also applicable to automatic driving control for following another vehicle or automatic driving control for retaining the vehicle within the lane. Further, the photoelectric conversion system is applicable not only to vehicles but also to moving bodies (moving apparatuses) such as vessels, airplanes, and industrial robots. In addition, the photoelectric conversion system 1301 is applicable not only to moving bodies but also to intelligent transport systems (ITS's) and a wide range of apparatuses utilizing object recognition.

The disclosure makes it possible to reduce the power consumption of the counter circuit by optimizing the resolution of the AD conversion according to the luminance of incident light.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-184492, filed Nov. 4, 2020, which is hereby incorporated by reference herein in its entirety.

What is claimed is:

1. An analog-to-digital conversion circuit comprising:
   a comparator circuit configured to perform processing of comparison between an analog signal and a ramp signal; and
   a counter configured to perform count processing in parallel with the comparison processing by the comparator circuit,
   wherein the analog-to-digital conversion circuit acquires digital data, which is a count value corresponding to the comparison processing, and subjects the analog signal to analog-to-digital conversion,
   wherein a period from the start to the end of the analog-to-digital conversion of the one analog signal includes a first period and a second period following the first period,
   wherein the first and the second periods are switched based on an output of the counter, and
   wherein the count processing is performed at a high speed during the first period and performed at a low speed during the second period.

2. The analog-to-digital conversion circuit according to claim 1, wherein a plurality of clocks with different frequencies is input to the counter.

3. The analog-to-digital conversion circuit according to claim 1, further comprising:
   an inverter circuit configured to invert the output of the most significant bit of the counter; and
   a gating unit including a logic circuit to which the output of the least significant bit of the counter and the output of the most significant bit thereof via the inverter circuit are input.

4. The analog-to-digital conversion circuit according to claim 1, further comprising:
   a multiplexer to which a plurality of clocks with different frequencies is input and which is configured to be controlled by the output of the counter; and
   a gating circuit including the multiplexer that outputs different clock frequencies in a case where the output of the most significant bit of the counter is High and in a case where the output of the most significant bit of the counter is Low.

5. The analog-to-digital conversion circuit according to claim 1, wherein the first period is measured by the counter.

6. A photoelectric conversion apparatus comprising:
   a plurality of pixels; and
   the analog-to-digital conversion circuit according to claim 1, wherein the analog signal is a signal based on electric charges generated in the pixels.

7. The photoelectric conversion apparatus according to claim 6,
   wherein the plurality of pixels is disposed in an array form, and each column of the array is connected to a column memory, and
   wherein the counter includes a common counter that supplies a count value to a plurality of the column memories.

8. The photoelectric conversion apparatus according to claim 7, wherein the counter includes a column counter connected with each column of the array.

9. The photoelectric conversion apparatus according to claim 8,
   wherein the count value has a plurality of bits,
   wherein the common counter generates values of lower bits of the count value, and
   wherein the column counter generates values of higher bits of the count value.

10. The photoelectric conversion apparatus according to claim 6,
wherein the photoelectric conversion apparatus comprises a first pixel group and a second pixel group,
wherein the first pixel group includes the plurality of pixels,
wherein the second pixel group includes pixels different from the plurality of pixels, and
wherein an analog signal based on electric charges generated in the pixels included in the second pixel group is converted into digital data with a third resolution.

11. The photoelectric conversion apparatus according to claim 10, wherein the pixels included in the second pixel group are pixels for focal distance detection.

12. A photoelectric conversion system comprising:
the photoelectric conversion apparatus according to claim 6; and
a signal processing circuit configured to generate an image by using a signal output by the photoelectric conversion apparatus.

13. A moving body including the photoelectric conversion apparatus according to claim 6, further comprising a control circuit configured to control a movement of the moving body by using a signal output by the photoelectric conversion apparatus.

14. An analog-to-digital conversion circuit comprising:
a comparator circuit configured to perform processing of comparison between an analog signal and a ramp signal; and
a counter configured to perform count processing in parallel with the comparison processing by the comparator circuit,
wherein the analog-to-digital conversion circuit acquires digital data, which is a count value corresponding to the comparison processing, and subjects the analog signal to analog-to-digital conversion,
wherein a period from the start to the end of the analog-to-digital conversion of the one analog signal includes a first period and a second period following the first period,
wherein the first and the second periods are switched based on an output of the counter,
wherein, during the first period, the analog-to-digital conversion circuit performs the analog-to-digital conversion with a first resolution, and
wherein, during the second period, the analog-to-digital conversion circuit performs the analog-to-digital conversion with a second resolution that is lower than the first resolution.

15. The analog-to-digital conversion circuit according to claim 1, wherein a plurality of clocks with different frequencies is input to the counter.

16. The analog-to-digital conversion circuit according to claim 1, further comprising:
an inverter circuit configured to invert the output of the most significant bit of the counter; and
a gating circuit including a logic circuit to which the output of the least significant bit of the counter and the output of the most significant bit thereof via the inverter circuit are input.

17. The analog-to-digital conversion circuit according to claim 1, further comprising:
a multiplexer to which a plurality of clocks with different frequencies is input and which is configured to be controlled by the output of the counter; and
a gating circuit including the multiplexer that outputs different clock frequencies in a case where the output of the most significant bit of the counter is High and in a case where the output of the most significant bit of the counter is Low.

18. An analog-to-digital conversion circuit comprising:
a comparator circuit configured to perform processing of comparison between an analog signal and a ramp signal; and
a counter configured output a count value having a plurality of bits,
wherein the counter performs count processing in parallel with the comparison processing by the comparator circuit to output the count value,
wherein the analog-to-digital conversion circuit acquires digital data, which is a count value corresponding to the comparison processing, and performs analog-to-digital conversion,
wherein a period from the start to the end of the analog-to-digital conversion of the one analog signal includes a first period and a second period following the first period,
wherein the first and the second periods are switched based on an output of the counter, and
wherein at least one bit from the least significant bit side of the plurality of bits a signal of which changes during the first period is fixed to a predetermined potential during the second period.

19. The analog-to-digital conversion circuit according to claim 1, wherein a plurality of clocks with different frequencies is input to the counter.

20. The analog-to-digital conversion circuit according to claim 1, further comprising:
an inverter circuit configured to invert the output of the most significant bit of the counter; and
a gating circuit including a logic circuit to which the output of the least significant bit of the counter and the output of the most significant bit thereof via the inverter circuit are input.

* * * * *